United States Patent
Kawano et al.

(10) Patent No.: US 8,679,913 B2
(45) Date of Patent: Mar. 25, 2014

(54) METHOD FOR SR—TI—O-BASED FILM FORMATION

(75) Inventors: Yumiko Kawano, Nirasaki (JP); Susumu Arima, Nirasaki (JP); Akinobu Kakimoto, Nirasaki (JP); Toshiyuki Hirota, Tokyo (JP); Takakazu Kiyomura, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 292 days.

(21) Appl. No.: 12/676,237

(22) PCT Filed: Sep. 2, 2008

(86) PCT No.: PCT/JP2008/065706
§ 371 (c)(1),
(2), (4) Date: May 20, 2010

(87) PCT Pub. No.: WO2009/041219
PCT Pub. Date: Apr. 2, 2009

(65) Prior Publication Data
US 2011/0014797 A1    Jan. 20, 2011

(30) Foreign Application Priority Data
Sep. 4, 2007 (JP) .................. 2007-228745

(51) Int. Cl.
*H01L 21/8242* (2006.01)
*H01L 21/31* (2006.01)
*H01L 21/469* (2006.01)
*H01L 21/02* (2006.01)
*H01L 21/316* (2006.01)

(52) U.S. Cl.
CPC ...... *H01L 21/0228* (2013.01); *H01L 21/31604* (2013.01); *H01L 21/02197* (2013.01); *H01L 21/31691* (2013.01)
USPC ..... 438/240; 438/253; 438/785; 257/E21.211

(58) Field of Classification Search
CPC .................. H01L 21/31691; H01L 21/31604; H01L 21/02197; H01L 21/0228
USPC .......... 438/785, 778, 253, 240; 257/E21.211
See application file for complete search history.

(56) References Cited

U.S. PATENT DOCUMENTS 7,108,747 B1 * 9/2006 Leskela et al. .................. 117/88
2006/0219157 A1 * 10/2006 Rahtu et al. ....................... 117/4
(Continued)

FOREIGN PATENT DOCUMENTS

| JP | 2002-525426 A | 8/2002 |
| JP | 2003-059921 A | 2/2003 |

OTHER PUBLICATIONS

J.H.Lee et al, Plasma enhanced atomic layer deposition of SrTiO3 thin films with Sr(tmhd)2 and Ti(i-OPr)4, J. Vac. Sci. Technol, Sep./Oct. 2002, p. 1828-1830, A 20(5), American Vacuum Society.

(Continued)

*Primary Examiner* — Shouxiang Hu
(74) *Attorney, Agent, or Firm* — Abelman, Frayne & Schwab

(57) ABSTRACT

A film is formed so that the atomic numbers ratio of Sr to Ti, i.e., Sr/Ti, in the film is not less than 1.2 and not more than 3. The film is then annealed in an atmosphere containing not less than 0.001% and not more than 80% of $O_2$ at 500° C. or above. An SrO film forming step or a TiO film forming step are repeated a plurality of times so that a sequence, in which a plurality of SrO film forming steps or/and a plurality of TiO film forming steps are performed continuously, is included. When Sr is oxidized after the adsorption of Sr, $O_3$ and $H_2O$ are used as an oxidizing agent.

4 Claims, 14 Drawing Sheets

(56) References Cited

U.S. PATENT DOCUMENTS

2007/0134919 A1* 6/2007 Gunji et al. .................. 438/680
2008/0072819 A1 3/2008 Rahtu et al.

OTHER PUBLICATIONS

International Search Report for International Application No. PCT/JP2008/065706 with English translation mailed Feb. 3, 2009.

* cited by examiner

METHOD FOR SR—TI—O-BASED FILM FORMATION

This is a U.S. national stage application of International Application No. PCT/JP2008/065706, filed on 2 Sep. 2008. Priority under 35 U.S.C. §119(a) and 35 U.S.C. §365(b) is claimed from Japanese Application No. JP2007-228745, filed 4 Sep. 2007, the disclosure of which is also incorporated herein by reference.

TECHNICAL FIELD

The present invention relates to a method to form a Sr—Ti—O-based film, such as a SrTiO$_3$ film, and a storage medium.

BACKGROUND

In the semiconductor device, an integrated circuit has become highly integrated, and a DRAM has required the reduction of size and the enlargement of memory capacity of a memory cell. For this requirement, an MIM (metal-insulator-metal) structure capacitor has been spotlighted. Such a MIM structure capacitor uses a high dielectric material, such as strontium titanate (SrTiO$_3$), as an insulating film (dielectric film).

In the formation of a SrTiO$_3$ film for a DRAM capacitor, a method for forming a film by ALD has been conventionally widely used, in which an organic Sr raw material and an organic Ti raw material are used, and O$_3$ gas is used as an oxidant, [for example, "Plasma enhanced atomic layer deposition of SrTiO$_3$ thin films with Sr(tmhd)$_2$ and Ti(i-OPr)$_4$" J. Vac. Scl. Technol. A20(5), J. H. Lee et al. September/October 2002].

However, in forming a thin film by such a method, it is difficult to crystallize the thin film even with a stoichiometric composition of Sr:Ti=1:1 through annealing following the film formation depending on the kind of a substrate. It is preferable that a Sr—Ti—O-based material should be crystallized because it has a low dielectric constant in an amorphous state.

Meanwhile, in ALD, a SrO film forming process by a Sr raw material-purge-oxidant-purge, and TiO film forming process by a Ti raw material-purge-oxidant-purge are alternately repeated to form a film. However, in this method, adsorption may be inhibited according to the combination of raw materials. Accordingly, the composition of the formed film may be different from the required one.

Also, in ALD, the supply time for respective materials and an oxidant is set as a time when a film thickness is saturated. However, when O$_3$ is used as an oxidant, it takes a longer time to reach the saturation point depending on the kind of an organic Sr compound used as a Sr raw material, and the film thickness becomes very thick (0.3 to 0.4 nm) per 1 cycle at the saturation point. This may prevent the required SrO film from being formed.

SUMMARY OF THE INVENTION

The object of the present invention is to provide a method for forming a Sr—Ti—O-based film, which can stably generate a SrTiO$_3$ crystal.

It is another object of the present invention to provide a method for forming a Sr—Ti—O-based film, in which a required ratio of Sr and Ti can be achieved.

It is a further object of the present invention to provide a method for forming a Sr—Ti—O-based film, in which an oxidant can rapidly reach a supply saturation point and required SrO is formed, thereby obtaining a satisfactory Sr—Ti—O-based film.

It is a still further object of the present invention to provide a storage medium having a program stored therein, the program being designed for executing the above described method.

According to one aspect, there is provided a method for forming a Sr—Ti—O-based film on a substrate. The method includes disposing the substrate within a processing chamber, heating the substrate, forming the Sr—Ti—O-based film on the substrate by introducing a gaseous Ti raw material, a gaseous Sr raw material, and a gaseous oxidant into the processing chamber in a state where the substrate is heated in such a manner that a ratio of Sr to Ti (Sr/Ti) within the film is not less than 1.2 and not more than 3 in an atomic ratio, and annealing the substrate with the film in an atmosphere containing O$_2$ of 0.001% to 80% at 500° C. or more.

In the method according to the first aspect, the Sr—Ti—O-based film may be formed in such a manner that the ratio of Sr to Ti (Sr/Ti) within the film is not less than 1.4 and not more than 1.9 in a ratio of the number of atoms. Also, in forming of the Sr—Ti—O-based film, a SrO film formation process and a TiO film formation process may be performed multiple times, respectively. The SrO film formation process may include adsorbing Sr onto the substrate by introducing the gaseous Sr raw material into the processing chamber, oxidizing Sr by introducing the gaseous oxidant into the processing chamber, and then purging inside of the processing chamber. The TiO film formation process may include adsorbing Ti onto the substrate by introducing the gaseous Ti raw material into the processing chamber, oxidizing a Ti film by introducing the gaseous oxidant into the processing chamber, and then purging inside of the processing chamber. Also, when the SrO film formation process and the TiO film formation process are performed multiple times, and the SrO and the TiO film formation processes include a sequence where only the SrO film formation process is continuously performed multiple times.

According to a second aspect, there is provided a method to form a Sr—Ti—O-based film on a substrate. The method includes disposing the substrate within a processing chamber, heating the substrate, and forming the Sr—Ti—O-based film on the substrate by introducing a gaseous Ti raw material, a gaseous Sr raw material, and a gaseous oxidant into the processing chamber in a state where the substrate is heated. In forming of the Sr—Ti—O-based film, a SrO film formation process and a TiO film formation process are performed multiple times, respectively, and the SrO and TiO film formation processes include a sequence where either or both of the SrO film formation process and the TiO film formation process are continuously performed multiple times. The SrO film formation process includes adsorbing Sr onto the substrate by introducing the gaseous Sr raw material into the processing chamber, oxidizing Sr by introducing the gaseous oxidant into the processing chamber, and then purging inside of the processing chamber, and the TiO film formation process includes adsorbing Ti onto the substrate by introducing the gaseous Ti raw material into the processing chamber, oxidizing a Ti film by introducing the gaseous oxidant into the processing chamber, and then purging inside of the processing chamber.

In the method according to the second aspect, a set of performing the SrO film formation process multiple times, and then performing the TiO film formation process multiple times may be repeated multiple times. For example, a set of performing the SrO film formation process twice, and then performing the TiO film formation process twice may be repeated multiple times.

According to a third aspect, there is provided a method to form a Sr—Ti—O-based film on a substrate. The method includes disposing the substrate within a processing chamber, heating the substrate, and forming the Sr—Ti—O-based film on the substrate by introducing a gaseous Ti raw material, a gaseous Sr raw material, and a gaseous oxidant into the processing chamber in a state where the substrate is heated. In forming of the Sr—Ti—O-based film, a SrO film formation process and a TiO film formation process are performed multiple times, respectively. The SrO film formation process includes adsorbing Sr onto the substrate by introducing the gaseous Sr raw material into the processing chamber, oxidizing Sr by introducing the gaseous oxidant into the processing chamber, and then purging inside of the processing chamber. The TiO film formation process includes adsorbing Ti onto the substrate by introducing the gaseous Ti raw material into the processing chamber, oxidizing a Ti film by introducing the gaseous oxidant into the processing chamber, and then purging inside of the processing chamber, wherein as the oxidant, $O_3$ and $H_2O$ are used.

In the method according to the third aspect, a Sr compound having a cyclopentadienyl group, typically $Sr(C_5(CH_3)_5)_2$ may be used as the Sr raw material. In this case, among the above Oxidants, $H_2O$ may have a function of cleaving Sr and the cyclopentadienyl group as the oxidant, and $O_3$ may have a function of forming SrO.

According to a fourth aspect, there is provided a storage medium which operates in a computer and has a control program stored in the storage medium. The control program is designed to control a film forming apparatus. When the control program is executed, the control program controls the film forming apparatus by the computer in such a manner that a method to form a Sr—Ti—O-based film on a substrate is performed. The method includes disposing the substrate within a processing chamber, heating the substrate, forming the Sr—Ti—O-based film on the substrate by introducing a gaseous Ti raw material, a gaseous Sr raw material, and a gaseous oxidant into the processing chamber in a state where the substrate is heated in such a manner that a ratio of Sr to Ti (Sr/Ti) within the film is not less than 1.2 and not more than 3 in a ratio of the number of atoms, annealing the substrate with the film in an atmosphere containing $O_2$ of 0.001% to 80% at 500° C. or more.

According to a fifth aspect, there is provided a storage medium which operates in a computer and has a control program stored in the storage medium. The control program is designed to control a film forming apparatus. When the control program is executed, the control program controls the film forming apparatus by the computer in such a manner that a method to form a Sr—Ti—O-based film on a substrate is performed. The method includes disposing the substrate within a processing chamber, heating the substrate, and forming the Sr—Ti—O-based film on the substrate by introducing a gaseous Ti raw material, a gaseous Sr raw material, and a gaseous oxidant into the processing chamber in a state where the substrate is heated. In forming of the Sr—Ti—O-based film, a SrO film formation process and a TiO film formation process are performed multiple times, respectively, and the SrO and TiO film formation processes include a sequence where either or both of the SrO film formation process and the TiO film formation process are continuously performed multiple times. The SrO film formation process includes adsorbing Sr onto the substrate by introducing the gaseous Sr raw material into the processing chamber, oxidizing Sr by introducing the gaseous oxidant into the processing chamber, and then purging inside of the processing chamber. The TiO film formation process includes adsorbing Ti onto the substrate by introducing the gaseous Ti raw material into the processing chamber, oxidizing a Ti film by introducing the gaseous oxidant into the processing chamber, and then purging inside of the processing chamber.

According to a sixth aspect, there is provided a storage medium which operates in a computer and has a control program stored in the storage medium. The control program is designed to control a film forming apparatus. When the control program is executed, the control program controls the film forming apparatus by the computer in such a manner that a method to form a Sr—Ti—O-based film on a substrate is performed. The method includes disposing the substrate within a processing chamber, heating the substrate, and forming the Sr—Ti—O-based film on the substrate by introducing a gaseous Ti raw material, a gaseous Sr raw material, and a gaseous oxidant into the processing chamber in a state where the substrate is heated. In forming of the Sr—Ti—O-based film, a SrO film formation process and a TiO film formation process are performed multiple times, respectively. The SrO film formation process includes adsorbing Sr onto the substrate by introducing the gaseous Sr raw material into the processing chamber, oxidizing Sr by introducing the gaseous oxidant into the processing chamber, and then purging inside of the processing chamber. The TiO film formation process includes adsorbing Ti onto the substrate by introducing the gaseous Ti raw material into the processing chamber, oxidizing a Ti film by introducing the gaseous oxidant into the processing chamber, and then purging inside of the processing chamber, wherein as the oxidant, $O_3$ and $H_2O$ are used.

According to the present invention, since the film formation is carried out in such a manner that a Sr/Ti ratio within a film can be in a range of 1.2 to 3 in a ratio of the number of atoms, and the formed film is annealed in atmosphere containing $O_2$ of 0.001% to 80% at 500° C. or more, it is possible to stably generate an $SrTiO_3$ crystal in a thin film of 7 to 20 nm. In other words, after the film formation with a certain composition with a large amount of Sr, the crystallization of $SrTiO_3$ is achieved by the migration of Ti to the surface through annealing under the existence of $O_2$. Thus, it is possible to achieve the crystallization in the thin film.

Also, according to the present invention, a sequence for continuously performing only one or both of a SrO film formation process and a TiO film formation process multiple times is repeated multiple times. Accordingly, even in a condition where adsorption inhibition may be caused according to the combination of raw materials, such adsorption inhibition can be avoided while the same film formation process is continuously repeated. Thus, it is possible to obtain a Sr—Ti—O-based film with the required composition.

Also, according to the present invention, in obtaining a Sr—Ti—O-based film by performing a SrO film formation process and a TiO film formation process multiple times, $O_3$ and $H_2O$ are used as oxidants. Thus, it is possible to rapidly saturate the oxidants and to obtain a satisfactory Sr—Ti—O-based film through the formation of required SrO. In a case where only $O_3$ is used as an oxidant, and a specific organic Sr compound (such as $Sr(C_5(CH_3)_5)_2$) is used as a Sr raw material, SrO is formed after the bonds in an organic moiety of the organic Sr compound used as the Sr raw material are separately cleaved. Thus, it takes time to saturate the cleavage. However, when $H_2O$ is used in combination with $O_3$ as the oxidant, $H_2O$ mainly contributes to the cleavage of a bond between Sr and an organic moiety, while cleaving the bond in an organic moiety to only minimal extent. Thus, the cleavage is saturated early. Then, the application of $O_3$ may form required SrO. Also, the use of only $H_2O$ as the oxidant forms $Sr(OH)_2$, thereby causing an unpreferable result. On the other hand, through the application of $O_3$ following $H_2O$, satisfactory SrO can be obtained.

DETAILED DESCRIPTION OF THE EXEMPLARY EMBODIMENTS

Hereinafter, exemplary embodiments of the present invention will be described with reference to the accompanying drawings.

Figure 1:
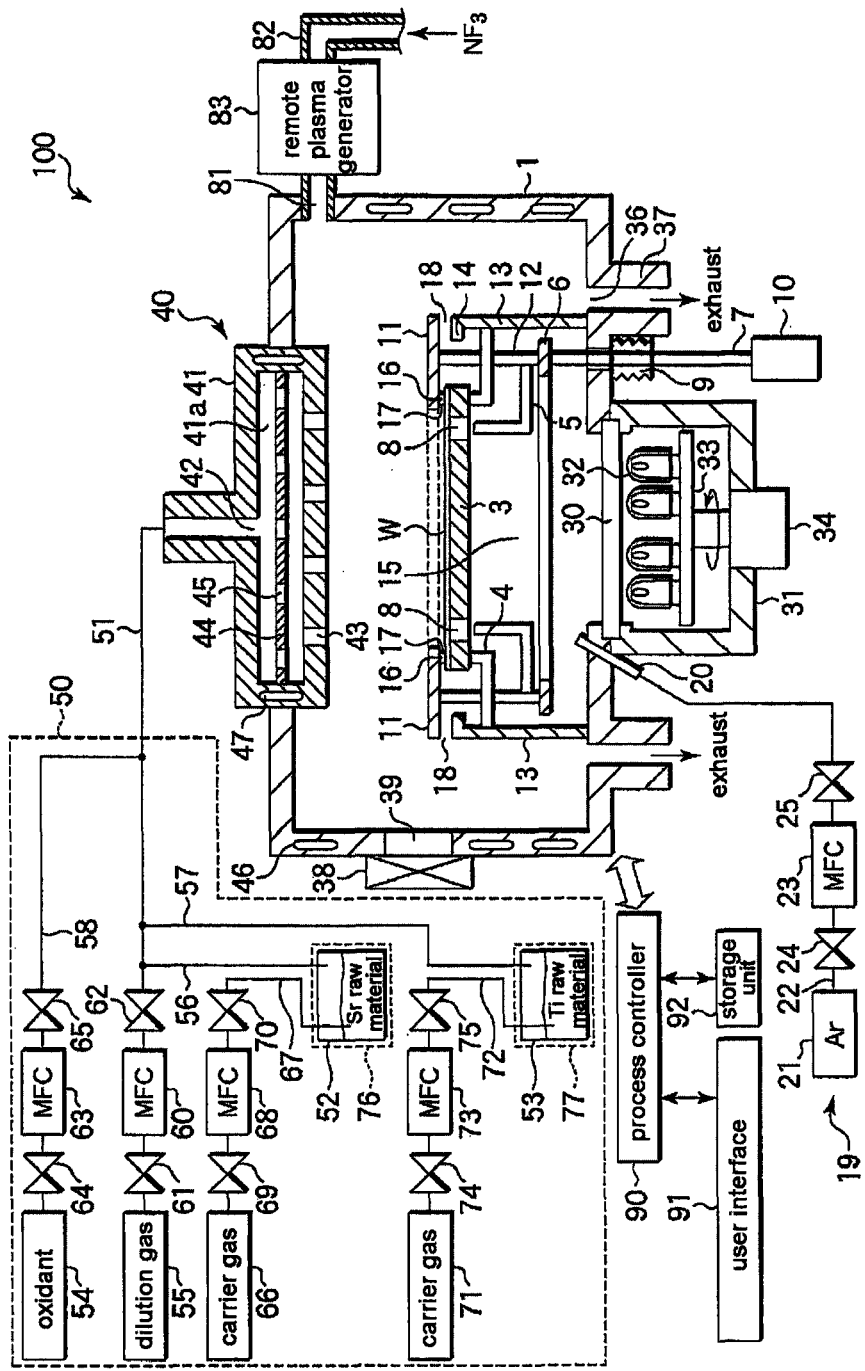
FIG. 1 is a cross-sectional view illustrating a schematic configuration of a film forming apparatus which can be used for a Sr—Ti—O-based film forming method according to the present invention.

FIG. 1 is a cross-sectional view illustrating a schematic configuration of a film forming apparatus which can be used for a Sr—Ti—O-based film forming method according to the present invention. A film forming apparatus 100 shown in FIG. 1 includes a processing chamber 1 formed of aluminum or the like in a cylindrical or cubic shape. A loading table 3 is provided within processing chamber 1. A semiconductor wafer W as a to-be-processed substrate is loaded on loading table 3. Loading table 3 is made of an aluminum compound, such as a carbon material, aluminum nitride, or the like, with a thickness of approximately 1 mm.

A cylindrical partition wall 13 is formed at the outer circumferential side of loading table 3. For example, partition wall 13 is made of aluminum. Partition wall 13 stands up from the bottom portion of processing chamber 1 and its upper end is horizontally bent to form a flexure 14 in an L-shape. An inert gas purging chamber 15 is formed at the back surface side of loading table 3 by providing the above-described cylindrical partition wall 13. The upper surface of flexure 14 is substantially on the same plane with the upper surface of loading table 3, and is spaced apart from the outer circumference of loading table 3. A connecting rod 12 is inserted through a gap between flexure 14 and loading table 3. Loading table 3 is supported by three supporting arms 4 (only two supporting arms are shown in the drawing). The supporting arms extend from the upper inner wall of partition wall 13.

A plurality of L-shaped lifter pins 5, for example, three lifter pins, (only two lifter pins are shown in the drawing) are provided below loading table 3. Lifter pins 5 protrude upwardly from a ring-shaped supporting member 6. Supporting member 6 is configured to move up and down by an elevating rod 7. Elevating rod 7 penetrates the bottom portion of processing chamber 1 and is moved up and down by an actuator 10 positioned below processing chamber 1. An insertion hole 8 is formed in a portion of loading table 3 corresponding to lifter pin 5 to pass through loading table 3. When actuator 10 raises lifter pin 5 through elevating rod 7 and supporting member 6, lifter pin 5 is inserted through insertion hole 8 to be able to raise semiconductor wafer W. A portion of elevating rod 7, which is inserted into processing chamber 1, is covered with bellows 9. This prevents the outside air from entering from the inserted portion into processing chamber 1.

A ring-shaped clamp ring member 11 made of ceramic, such as aluminum nitride, is provided at the circumferential periphery of loading table 3 to support and fix the circumferential periphery of semiconductor wafer W on loading table 3 side. The ring-shape of clamp ring member 11 corresponds to a disk-shaped outline of semiconductor wafer W. Clamp ring member 11 is connected to supporting member 6 by connecting rod 12 and is configured to move up and down together with lifter pin 5. Lifter pin 5 or connecting rod 12 is made of ceramics, such as alumina.

A plurality of contact protuberances 16 are placed at the bottom surface of the inner periphery side of ring-shaped clamp ring member 11. Contact protuberances 16 are positioned at substantially same intervals along the circumferential direction. During the clamping of clamp ring member 11, the lower end surfaces of contact protuberances 16 contact with and press the upper surface of the circumferential periphery of semiconductor wafer W. Also, contact protuberance 16 has a diameter of approximately 1 mm and a height of approximately 50 μm, and, at this portion, a ring-shaped first gas purging gap 17 is formed during the clamping. Also, during the clamping, the overlapping extent of the circumferential periphery of semiconductor wafer W with the inner periphery side of clamp ring member 11 is approximately several mm, which corresponds to a passage length L1 of first gas purging gap 17.

The circumferential periphery of clamp ring member 11 is positioned and a ring-shaped second gas purging gap 18 is formed above flexure 14 at the upper end of partition wall 13. Second gas purging gap 18 has a width of approximately 500

μm, which is approximately ten times greater than that of first gas purging gap 17. The overlapping extent of the circumferential periphery of clamp ring member 11 with flexure 14 is approximately 10 mm, which corresponds to a passage length of second gas purging gap 18. Accordingly, the inert gas within inert gas purging chamber 15 may be discharged from both gaps 17 and 18 to a processing space side.

An inert gas supply mechanism 19 is provided at the bottom portion of processing chamber 1 to supply inert gas to inert gas purging chamber 15. Gas supply mechanism 19 includes a gas nozzle 20 to introduce inert gas (for example, Ar gas) into inert gas purging chamber 15, an Ar gas source 21 to supply Ar gas as the inert gas, and a gas pipe 22 to introduce the Ar gas from Ar gas source 21 to gas nozzle 20. Also, a mass flow controller (MFG) 23 as a flow controller and open/close valves 24 and 25 are provided at gas pipe 22. Instead of Ar gas, He gas may be used as the inert gas.

A transmission window 30 made of a heat ray transmissive material, such as quartz, is airtightly provided in the bottom portion of processing chamber 1 right below loading table 3. A cubic heating chamber 31 is provided below transmission window 30 to surround transmission window 30. A plurality of heating lamps 32 as a heating means are mounted on a rotating table 33 within heating chamber 31. Rotating table 33 functions as a reflecting mirror. Rotating table 33 rotates through a rotating shaft by a rotating motor 34 provided at the bottom portion of heating chamber 31. Accordingly, the heat rays emitted from heating lamps 32 penetrate through transmission window 30 and heat the lower surface of loading table 3 by means of irradiation.

Also, an exhaust hole 36 is formed in the circumferential periphery of the bottom portion of processing chamber 1, and exhaust hole 36 is connected to an exhaust pipe 37 connected to a vacuum pump (not shown). Through the exhaust by exhaust hole 36 and exhaust pipe 37, the inside of processing chamber 1 may be maintained with a predetermined degree of vacuum. Also, a loading/unloading hole 39 and a gate valve 38 are provided in the lateral wall of processing chamber 1. Semiconductor wafer W is loaded and unloaded through the loading/unloading hole 39 and gate valve 38 opens or closes loading/unloading hole 39.

Meanwhile, the top portion of processing chamber 1, opposed to loading table 3, is provided with a shower head 40 to introduce source gas, etc. into processing chamber 1. For example, shower head 40 is made of aluminum, etc. Shower head 40 includes a disk-shaped main body 41 having a space 41a formed therewithin. A gas introducing hole 42 is formed in the top portion of main body 41. A processing gas supply mechanism 50 is connected to gas introducing hole 42 via a pipe 51 of processing gas supply mechanism 50. Processing gas supply mechanism 50 supplies processing gas required for forming a Sr—Ti—O-based film, such as a $SrTiO_3$ film. A plurality of gas injection holes 43 are disposed over the entire surface in the bottom portion of head main body 41. Gas injection holes 43 discharge the gas supplied into head main body 41 to the processing space within processing chamber 1. Thus, it is possible to discharge gas over the entire surface of semiconductor wafer W. Also, a diffusing plate 44 having a plurality of gas diffusing holes 45 is disposed in space 41a within head main body 41, so that gas can be more uniformly supplied to the surface of semiconductor wafer W. Also, cartridge heaters 46 and 47 for adjusting the temperature are provided, respectively, within the lateral wall of processing chamber 1, within the lateral wall of shower head 40, and within a surface opposite to the wafer and disposed with gas injection holes 43. Thus, it is possible to maintain the predetermined temperature of the lateral walls and the shower head which contact with gas.

Processing gas supply mechanism 50 includes a Sr raw material reservoir 52 to store a Sr raw material, a Ti raw material reservoir 53 to store a Ti raw material, an oxidant source 54 to supply an oxidant, and a dilution gas source 55 to supply dilution gas, such as argon gas, for diluting the gas within processing chamber 1.

Pipe 51 connected to shower head 40 is connected to a pipe 56 extending from Sr raw material reservoir 52, a pipe 57 extending from Ti raw material reservoir 53, and a pipe 58 extending from oxidant source 54. Also, dilution gas source 55 is connected to pipe 51. Pipe 51 is provided with a mass flow controller (MFC) 60 as a flow controller and open/close valves 61 and 62 downstream and upstream of MFC 60. Also, pipe 58 is provided with a mass flow controller (MFC) 63 as a flow controller and open/close valves 64 and 65 downstream and upstream of MFC 63.

A carrier gas source 66 is connected to Sr raw material reservoir 52 via a pipe 67. Carrier gas source 66 supplies carrier gas for bubbling of Ar, etc. Pipe 67 is provided with a mass flow controller (MFC) 68 as a flow controller and open/close valves 69 and 70 downstream and upstream of MFC 68. Also, a carrier gas source 71 for supplying carrier gas, such as Ar, is connected to Ti raw material reservoir 53 via a pipe 72. Pipe 72 is provided with a mass flow controller (MFC) 73 as a flow controller and open/close valves 74 and 75 downstream and upstream of MFC 73. Heaters 76 and 77 are provided at Sr raw material reservoir 52 and Ti raw material reservoir 53, respectively. The Sr raw material stored in Sr raw material reservoir 52 and the Ti raw material stored in Ti raw material reservoir 53 are heated by heaters 76 and 77 and supplied to processing chamber 1 by bubbling. Also, although not shown, a heater is provided at a pipe supplying the Sr raw material or the Ti raw material in an evaporated state.

A cleaning gas introduction port 81 for introducing $NF_3$ gas as a cleaning gas is provided at the upper portion of the lateral wall of processing chamber 1. A pipe 82 for supplying $NF_3$ gas is connected to cleaning gas introduction port 81 and a remote plasma generator 83 is provided at pipe 82. Also, $NF_3$ gas supplied through pipe 82 is plasmarized in remote plasma generator 83 and is supplied into processing chamber 1, thereby cleaning the inside of processing chamber 1. Also, remote plasma generator 83 may be provided right above shower head 40 and the cleaning gas may be supplied through shower head 40. Also, $F_2$ may be used instead of $NF_3$, and no-plasma thermal-cleaning may be carried out by $ClF_3$, etc. without using remote plasma.

Film forming apparatus 100 includes a process controller 90 having a micro processor (computer). The respective components of film forming apparatus 100 are connected to and controlled by process controller 90. Also, a keyboard or a user interface 91 is connected to process controller 90. Using the keyboard, an operator performs the input of a command for managing the respective components of film forming apparatus 100. User interface 91 includes a display, etc. to visually display the operation state of the respective components of film forming apparatus 100. Also, a storage unit 92 is connected to process controller 90. Storage unit 92 stores a processing recipe or various database. The processing recipe includes a control program for allowing film forming apparatus 100 to perform various processes under the control of process controller 90, or a control program for allowing the respective components of film forming apparatus 100 to perform predetermined processes according to processing conditions. The processing recipe is stored in a storage medium within storage unit 92. The storage medium may be a fixed-type medium, such as a hard disk, or a transferable-type medium, such as CD-ROM, DVD, flash memory, etc. Also, the processing recipe may be appropriately transmitted from another device, for example, via a dedicated line.

Also, any processing recipe, as required, is called from storage unit 92 in accordance with the instruction, etc. from user interface 91 and is executed on process controller 90, thereby performing a required process in film forming apparatus 100 under the control of process controller 90.

Hereinafter, exemplary embodiments of a film forming method performed by using the above described film forming apparatus will be described.

First Exemplary Embodiment

In the first exemplary embodiment, at first, gate valve 38 is opened and a semiconductor wafer W is taken into processing chamber 1 through loading/unloading hole 39 and is loaded on loading table 3. Loading table 3 has been heated by heat rays which were previously emitted from heating lamps 32 and transmitted from transmission window 30. Semiconductor wafer W is heated by the heat of loading table 3. Then, dilution gas source 55 supplies dilution gas, such as Ar gas, at a flow rate of 100 to 800 mL/sec(sccm). Meanwhile, the inside of processing chamber 1 is exhausted by a vacuum pump (not shown) via exhaust hole 36 and exhaust pipe 37, thereby forming a pressure of approximately 39 to 665 Pa within processing chamber 1. Herein, the heating temperature of semiconductor wafer W is set to be within a range of 200 to 400° C.

Then, the film formation is actually started by controlling the flow rate of the dilution gas, such as Ar gas, to be in a range of 100 to 500 mL/sec(sccm) and controlling the pressure within processing chamber 1 to be in a range of 6 to 266 Pa (a film forming pressure). Also, the pressure within processing chamber 1 is adjusted by an automatic pressure controller (APC) provided in exhaust pipe 37.

In the present exemplary embodiment, a SrO film formation process for forming a thin SrO film and TiO film formation process forming a thin TiO film are performed multiple times, and then annealing is performed, thereby forming a Sr—Ti—O-based film. The SrO film formation process includes a step for supplying a Sr raw material into processing chamber 1 (step 1), a step for purging the inside of processing chamber 1 (step 2), a step for decomposing and oxidizing the Sr raw material by supplying an oxidant into processing chamber 1 (step 3), and a step for purging the inside of processing chamber 1 (step 4). TiO film formation process includes a step for supplying a Ti raw material into processing chamber 1 (step 5), a step for removing the remaining Ti raw material by purging the inside of processing chamber 1 (step 6), a step for decomposing and oxidizing the Ti raw material by supplying an oxidant into processing chamber 1 (step 7), and a step for purging the inside of processing chamber 1 and removing the remaining oxidant (step 8). The film forming conditions are controlled in such a manner that the ratio of Sr to Ti (Sr/Ti) within the film is not less than 1.2 and not more than 3 in a ratio of the number of atoms. After the film formation, the annealing is performed at 500° C. or more in the atmosphere containing $O_2$ (not less than 0.001% and not more than 80%). Also, although the film of the TiO film formation process is actually a TiOx (x is between 1 and 2) due to the change of the oxygen content within the film, the film is simply referred as a 'TiO film' for convenience sake.

Figure 2:
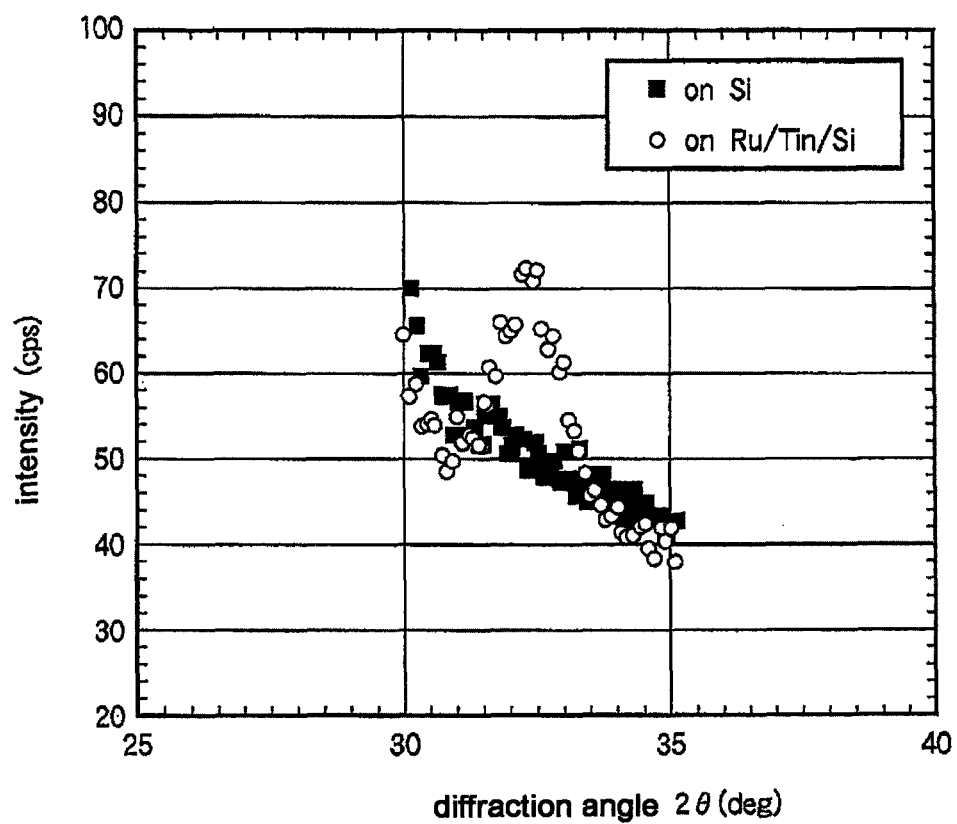
FIG. 2 shows X-ray diffraction patterns when a 5 nm Sr—Ti—O-based film is formed on an Si substrate, and an Ru(50 nm)/TiN(30 nm)/Si structure with the common process, followed by annealing

In forming a Sr—Ti—O-based thin film, there are some cases where the crystallization is not achieved according to the surface state of the used substrate even though the thin film is formed with a stoichiometric composition. For example, if the substrate surface is Ru, the crystallization is relatively easy. On the other hand, on a Si, or a metal nitride film of TiN, or the like, or an amorphous oxide film of Al2O3, ZrO2, or the like, it is difficult to crystallize the film. FIG. 2 shows X-ray diffraction patterns when a Sr—Ti—O-based film of 5 nm is formed on an Si substrate and an Ru(50 nm)/TiN(30 nm)/Si structure by the common process and annealed in the $N_2$ atmosphere containing $O_2$ (less than 0.001%) under the condition of 600° C. and 120 min. Herein, the Ru(50 nm)/TiN(30 nm)/Si structure is made by forming a 30 nm TiN film on an Si substrate and further forming a 50 nm Ru film thereon. The Sr/Ti ratio of the film on Si was 1.35, which was measured by XRF (X-ray fluorescence analysis). According to FIG. 2, in the Sr—Ti—O-based film on Si, a peak of $SrTiO_3$ is not shown, but in the Sr—Ti—O-based film on Ru, a peak of $SrTiO_3$ (110) is shown at approximately 32.5 degree. Herein, the peak indicates crystallization. Thus, it can be understood that the Sr—Ti—O-based film is easily crystallized on Ru. However, through the method according to the present invention, it is possible to stably crystallize $SrTiO_3$ although the substrate surface is made of Si, TiN, or the like (on which it is difficult to crystallize a Sr—Ti—O-based film) and the film is a thin film of 7 to 20 nm. In other words, after the film formation with a certain composition with a large amount of Sr, the crystallization of $SrTiO_3$ is achieved by the migration of Ti to the surface through annealing under the atmosphere containing $O_2$. Thus, it is possible to achieve the crystallization in the thin film.

Herein, when Sr/Ti is less than 1.2 in a ratio of the number of atoms, Ti in the surface is excessively increased, thereby making it difficult to crystallize the surface of the film, and, on the other hand, when Sr/Ti is more than 3 in a ratio of the number of atoms, the absolute quantity of Ti is excessively decreased, thereby making it difficult to crystallize the surface. The ratio of Sr/Ti more preferably ranges from 1.4 to 1.9.

Figure 3:
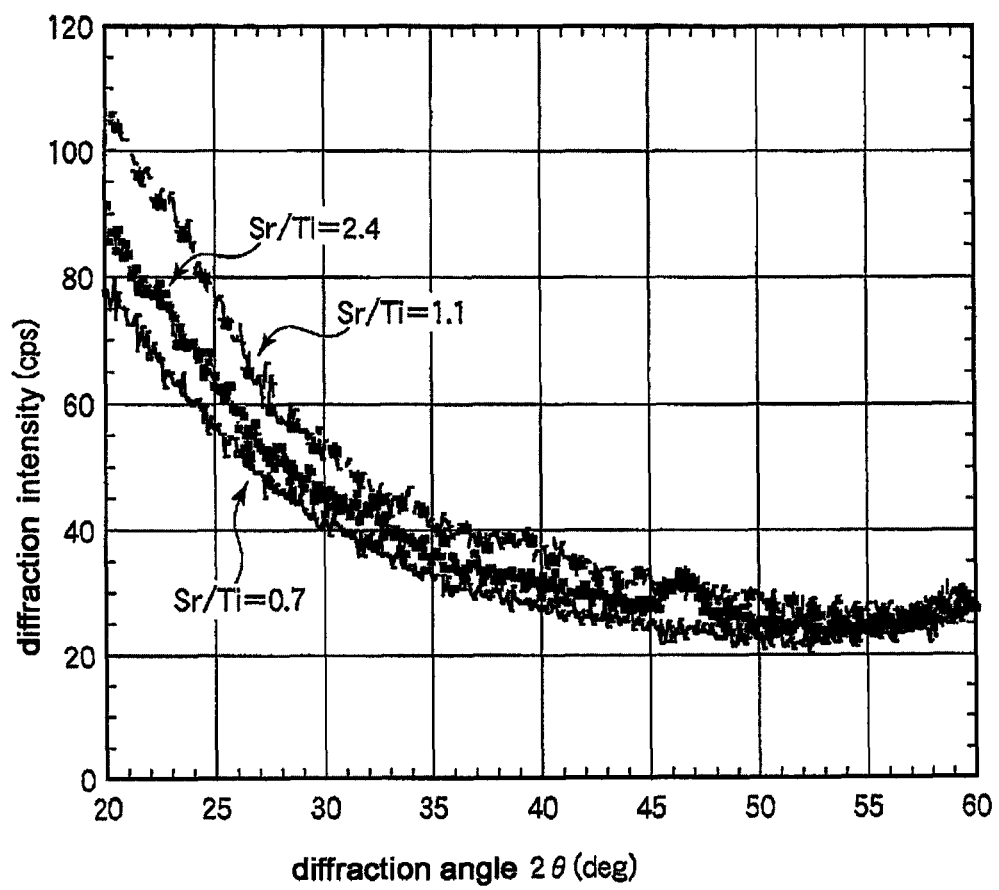
FIG. 3 shows X-ray diffraction patterns of three kinds of Sr—Ti—O-based films having Sr/Ti ratios of 0.7, 1.1, and 2.4, respectively, in which the films were formed by adjusting fabrication conditions.

FIG. 3 shows X-ray diffraction patterns of three kinds of Sr—Ti—O-based films which are formed on Si substrates by adjusting fabrication conditions and have Sr/Ti ratios of 0.7, 1.1, and 2.4, respectively, measured by XRF. Also, after the film formation, these films were annealed in the atmosphere of $O_2$ (concentration: 10%) at 600° C. As shown in FIG. 3, in the film having a Sr/Ti ratio of 2.4, it was found that a peak indicating a $SrTiO_3$ crystal exists. In other words, when the Sr/Ti ratio of the film satisfies the above-mentioned range, it was found that a $SrTiO_3$ is crystallized. On the other hand, in the films having Sr/Ti ratios of 0.7 and 1.1 out of the above-mentioned range, it was found that there exists no clear peak and the film is not crystallized. Also, the three kinds of Sr—Ti—O-based films with Sr/Ti ratios of 0.7, 1.1, and 2.4 have film thicknesses of 5.5 nm, 6.6 nm, and 8.2 nm, respectively.

The $O_2$ content within the atmosphere of annealing following film formation is set to be in a range of 0.001% to 80%, because it is difficult to generate a $SrTiO_3$ crystal due to the lack of oxygen within the film when the $O_2$ content is less than 0.001%, and an excessive amount of oxygen significantly oxidizes Ru, TiN, Si as a basis of the Sr—Ti—O-based film when the $O_2$ content is greater than 80%. Also, the temperature is set to be 500° C. or more for providing heat energy required for the crystallization.

Figure 4:
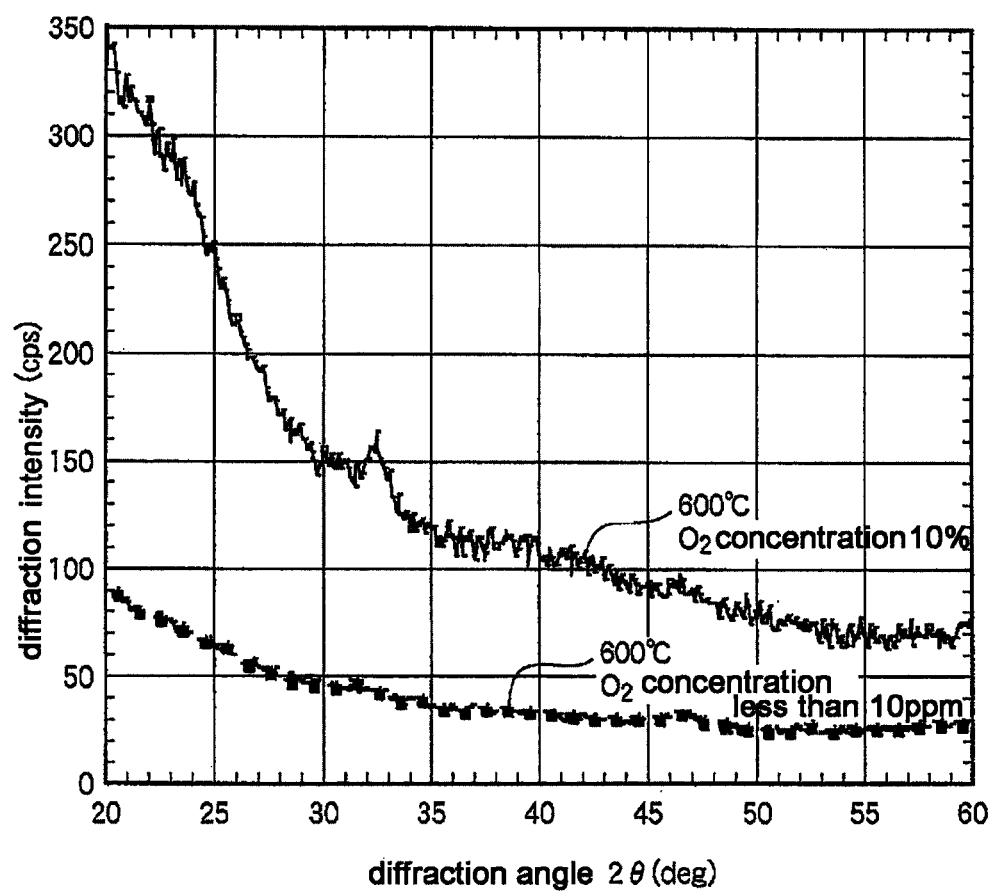
FIG. 4 compares X-ray diffraction patterns of Sr—Ti—O-based films, between a case of annealing in the atmosphere of 10% $O_2$ concentration and a case of annealing in the atmosphere of $O_2$ concentration of less than 10 ppm, after the Sr—Ti—O-based films were formed with Sr/Ti ratio of 2.4.

FIG. 4 relatively shows X-ray diffraction patterns of one Sr—Ti—O-based film annealed in the atmosphere of 10% $O_2$ concentration and another Sr—Ti—O-based film annealed in the atmosphere of $O_2$ concentration of less than 3 ppm in a case where both Sr—Ti—O-based films were formed on Si so that Sr/Ti measured by XRF is 2.4. As shown in FIG. 4, it was found that there exists a peak indicating a SrTiO$_3$ crystal and the SrTiO$_3$ crystal is generated in the atmosphere of 10% O$_2$ concentration. On the other hand, there exists no clear peak, and thus the film is not crystallized in the atmosphere of O$_2$ concentration of less than 3 ppm.

Hereinafter, the fabrication conditions will be described in detail. In film formation, at least one of a Sr raw material, a Ti raw material, the selection of oxidant, a flow rate, a supply time, and a sequence may be adjusted in order to adjust Sr/Ti to be an appropriate value.

Figure 5:
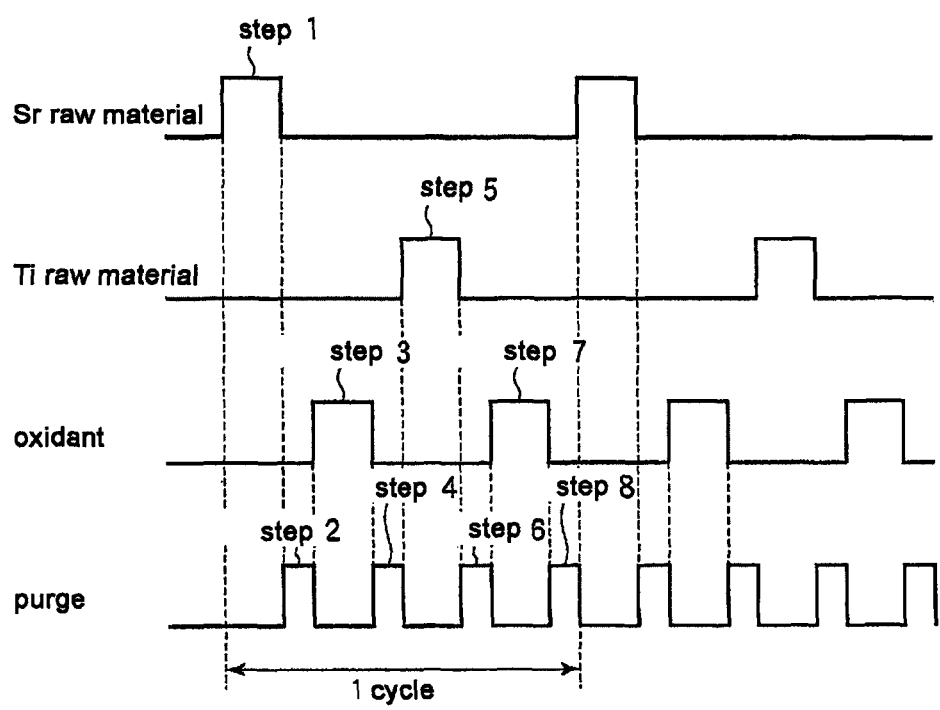
FIG. 5 shows a sequence of film formation according to an ALD method.

For the sequence, an ALD method as shown in FIG. 5 is typically employed, in which a SrO film formation process and a TiO film formation process are alternately repeated. In the present embodiment, the SrO film formation process may be continuously repeated multiple times to increase an amount of Sr in the composition.

In step 1, the Sr raw material is supplied from Sr raw material reservoir 52 heated up to approximately 150 to 230° C. by the heater 76 into processing chamber 1 by bubbling via shower head 40. An organic Sr compound, which has been used conventionally, may be appropriately used as the Sr raw material. For example, Sr(DPM)$_2$ or Sr(C$_5$(CH$_3$)$_5$)$_2$ may be used. From among these, Sr(C$_5$(CH$_3$)$_5$)$_2$ has a low vapor pressure and is easy to handle, and thus may be appropriately used. During the supply of the Sr raw material, a dilution gas from dilution gas source 55, such as Ar gas, is supplied at a flow rate of approximately 100 to 500 mL/min(sccm) and a carrier gas from carrier gas source 66, such as Ar gas, is supplied at a flow rate of approximately 50 to 500 mL/min (sccm). Also, the supply of the Sr raw material (step 1) is performed for approximately 0.1 to 20 seconds.

In oxidizing the Sr raw material of step 3, oxidant is supplied into processing chamber 1 from oxidant source 54 via shower head 40. Accordingly, the Sr raw material adsorbed on the surface of semiconductor wafer W is decomposed and oxidized, thereby forming a SrO film. The supply of the oxidant (step 3) is performed for approximately 0.1 to 20 seconds in a state where the dilution gas, such as Ar gas, has been supplied from dilution gas source 55 at a flow rate of 100 to 500 mL/min(sccm). The O$_3$ gas, O$_2$ gas, the plasma of H$_2$O, or O$_2$ gas may be appropriately used as the oxidant. In a case where O$_3$ gas is used as the oxidant, an ozone generator is used as oxidant source 54 and supplies ozone at a flow rate of approximately 50 to 200 g/Nm$^3$. Herein, O$_2$ gas having a flow rate of approximately 100 to 1000 mL/min(sccm) may be used together. In a case where H$_2$O is used as the oxidant, the flow rate of H$_2$O is preferably in a range of 2 to 50 mL/min (sccm).

In step 5, the Ti raw material is supplied from Ti raw material reservoir 53 heated by the heater 77 into processing chamber 1 by bubbling via shower head 40. Ti(OiPr)$_4$, Ti(OiPr)$_2$(DPM)$_2$, or the like may be appropriately used as the Ti raw material. Herein, the heating temperature of Ti raw material reservoir 53 for Ti(OiPr)$_4$ is in a range of 50 to 70° C. and the heating temperature for Ti(OiPr)$_2$(DPM)$_2$ is in a range of 150 to 230° C. During the supply of the Ti raw material, a dilution gas from dilution gas source 55, such as Ar gas, is supplied at a flow rate of approximately 100 to 500 mL/min (sccm), and a carrier gas from carrier gas source 71, such as Ar gas, is supplied at a flow rate of approximately 100 to 500 mL/min(sccm). Also, the supply of the Ti raw material (step 5) is performed for approximately 0.1 to 20 seconds.

In oxidizing the supplied Ti raw material of step 7, oxidant is supplied from oxidant source 54 into processing chamber 1 via shower head 40 under the same conditions as those in step 3 in a state where the dilution gas has been supplied from dilution gas source 55. Accordingly, the Ti raw material is decomposed and oxidized, thereby forming a TiO film.

The purging process in steps 2, 4, 6, and 8 is performed by stopping the supply of the above-mentioned materials, such as a Sr raw material gas, a Ti raw material gas, or an oxidant, and supplying dilution gas, such as Ar gas, into the processing chamber from dilution gas source 55. Herein, the flow rate of gas is in a range of 200 to 1000 mL/min(sccm). Also, this process may be performed under a vacuum without a flow of gas. This process is performed approximately 0.1 to 20 seconds.

The SrO film formation process of steps 1 to 4 and the TiO film formation process of steps 5 to 8 are repeated more than 20 times, for example, 100 times, in such a manner that Sr/Ti is not less than 1.2 and not more than 3 in a ratio of the number of atoms. Through these processes, a Sr—Ti—O-based film is formed with a predetermined thickness.

After the formation of the film as described above, O$_2$ gas is supplied from oxidant source 54 at a predetermined flow rate, thereby certainly oxidizing the film. Then, the supply of all gases is stopped and the inside of the processing chamber is vacuumized. Next, semiconductor wafer W within processing chamber 1 is taken out by a carrying arm.

Then, semiconductor wafer W is annealed in the O$_2$ atmosphere under the above-described conditions. The annealing may be carried out by RTA (Rapid Thermal Anneal) or a conventional heating furnace.

In the above-described sequence, a valve or a mass flow controller is controlled by process controller 90 based on the recipe stored in storage unit 92.

Hereinafter, the example of forming the film according to the present embodiment will be described.

In the apparatus in FIG. 1, the temperature of the loading table was set to be a film forming temperature of 320° C. by adjusting the lamp power and a 200 mm Si wafer was taken into the processing chamber using an arm of a carrying robot, thereby forming a Sr—Ti—O-based film. Sr(C$_5$(CH$_3$)$_5$)$_2$ used as a Sr raw material was kept in a container heated up to 160° C. and was supplied to the processing chamber by bubbling with Ar gas as a carrier gas. Ti(OiPr)$_4$ used as a Ti raw material was kept in a container heated up to 45° C. and was supplied to the processing chamber by bubbling with Ar gas as a carrier gas in the same manner as the Sr raw material. Also, O$_3$ having a concentration of 180 g/m$^3$ which was generated by passing O$_2$ gas of 500 mL/min (sccm) and N$_2$ gas of 0.5 mL/min (sccm) through an ozone generator was used as an oxidant.

Then, after the loading of the Si wafer on the loading table by the arm, a dilution Ar gas was supplied at a flow rate of 300 mL/min (sccm) for 30 seconds while the Si wafer was heated to a film forming temperature at a pressure of 133 Pa (1 Torr). Next, the film formation was carried out according to the above-described steps 1 to 8. Also, the temperature of the wafer was 290° C.

The Sr raw material supply of step 1 was performed for 10 seconds in a state where the flow rate of carrier Ar gas was 50 mL/min (sccm), the flow rate of dilution Ar gas was 200 mL/min (sccm), and processing chamber 1 was exhausted by completely opening a pressure control mechanism. The purging of step 2 was performed for 10 seconds under a vacuum state where processing chamber 1 was exhausted by completely opening the pressure control mechanism without through-flow gas.

The Sr raw material oxidization of step 3 was performed for 10 seconds in a state where the O$_3$ gas was used as an oxidant and processing chamber 1 was exhausted by completely opening the pressure control mechanism. The purging of step 4 was performed for 10 seconds under a vacuum state.

The Ti raw material supply of step 5 was performed for 10 seconds in a state where the flow rate of carrier Ar gas was 200 mL/min (sccm), the flow rate of dilution Ar gas was 200 mL/min (sccm), and processing chamber 1 was exhausted by completely opening the pressure control mechanism. The purging of step 6 was performed for 10 seconds under a vacuum state in the same manner as step 2.

The Ti raw material oxidization of step 7 and the purging of step 8 were carried out in the completely same manner as steps 3 and 4, respectively.

In steps 1 to 8, the pressure within the processing chamber depends on existence/non-existence and the flow rate of through-flow gas although the pressure control mechanism of processing chamber 1 is completely opened. For example, the pressure was 0.36 Torr in step 1, the pressure was 0 Torr in steps 2, 4, 6, and 8, the pressure was 0.52 Torr in step 3, and the pressure was 0.39 Torr in step 5.

A sequence of repeating the SrO film formation process including steps 1 to 4 twice and subsequently repeating the TiO film formation process including steps 5 to 8 twice was repeated 25 times. Next, $O_2$ gas was supplied at a flow rate of 300 mL/min (sccm) for 10 seconds while the pressure was controlled to be 40 Pa (0.3 Torr). Then, in a state where the supply of gas is stopped, the inside of the processing chamber was maintained under a vacuum state for 100 seconds and then the Si wafer was taken out from the processing chamber.

The Sr—Ti—O-based film formed by the above-described sequence measured 13 nm in thickness. When this film was measured by XRD (X-ray diffraction), a peak indicating a crystal was not shown. When the composition of this film was measured by XRF (X-ray fluorescence analysis), the ratio of Sr/Ti was 2.2 in a ratio of the number of atoms.

Then, an Si substrate with the Sr—Ti—O-based film was taken into an RTA device, and RTA was carried out under $N_2$ gas atmospheric pressure containing 0.2% $O_2$ gas at 600° C. and normal pressure. Next, since a peak of a $SrTiO_3$ crystal was shown by the measurement using XRD (X-ray diffraction), it was confirmed that the $SrTiO_3$ crystal was generated.

Second Exemplary Embodiment

In the same manner as the first exemplary embodiment, in the second exemplary embodiment, gate valve 38 is opened first, and a semiconductor wafer W is taken from loading/unloading hole 39 into processing chamber 1 and is loaded on loading table 3. Since loading table 3 has been previously heated by heating lamps 32, semiconductor wafer W is heated up to a predetermined temperature, for example, 200 to 400° C. Then, dilution gas, such as Ar gas, is supplied from dilution gas source 55 at a flow rate of 100 to 800 mL/sec (sccm). Meanwhile, the inside of processing chamber 1 is exhausted by a vacuum pump (not shown) via exhaust hole 36 and exhaust pipe 37, thereby vacuum-exhausting processing chamber 1 so that the pressure within processing chamber 1 is approximately 6 to 665 Pa. Then, the film formation is actually started by controlling the flow rate of the dilution gas, such as Ar gas, to be in a range of 100 to 500 mL/sec (sccm) and controlling the pressure within processing chamber 1 to be a film forming pressure of 13 to 266 Pa.

In the present exemplary embodiment, a SrO film formation process for forming a thin SrO film and a TiO film formation process for forming a thin TiO film are performed multiple times to form a Sr—Ti—O-based film. The SrO film formation process includes a step for supplying a Sr raw material into processing chamber 1 (step 1), a step for purging the inside of processing chamber 1 (step 2), a step for decomposing and oxidizing the Sr raw material by supplying an oxidant into processing chamber 1 (step 3), a step for purging the inside of processing chamber 1 (step 4). The TiO film formation process includes a step for supplying a Ti raw material into processing chamber 1 (step 5), a step for purging the inside of processing chamber 1 (step 6), a step for decomposing and oxidizing the Ti raw material by supplying an oxidant into processing chamber 1 (step 7), and a step for purging the inside of processing chamber 1 (step 8). A sequence of continuously performing either or both of the SrO film formation process and the TiO film formation process multiple times is included in the present embodiment.

In the above-described ALD method, there are some cases where the composition of a formed film is different from a required composition since adsorption inhibition may be caused depending on the combination of raw materials. However, through the employment of this sequence, the adsorption inhibition may be avoided while only one or both of the SrO film formation process and the TiO film formation process is continuously repeated. Thus, it is possible to achieve the substantially required composition. Also, through the employment of this method, it is possible to form a Sr—Ti—O-based film with a required composition between a composition containing a large amount of Sr and a composition containing a large amount of Ti.

Figure 6:
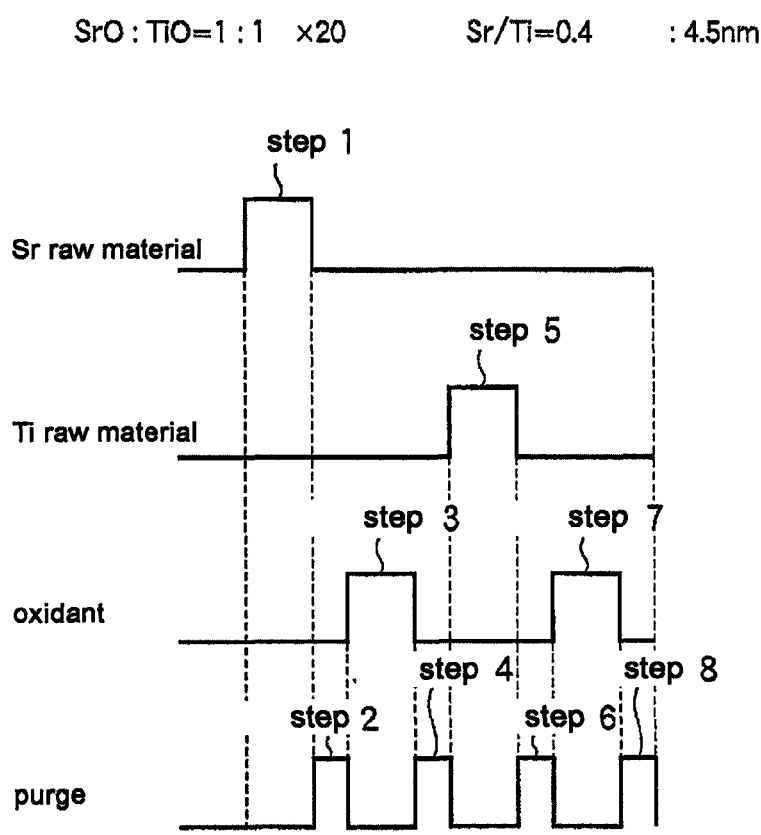
FIG. 6 shows a sequence, a film thickness, and a Sr/Ti composition ratio when a Sr—Ti—O-based film was formed by an ALD method.

As shown in FIG. 6, the SrO film formation process of steps 1 to 4 and the TiO film formation process of steps 5 to 8 using $Sr(C_5(CH_3)_5)_2$ as a Sr raw material and $Ti(OiPr)_4$ as a Ti raw material were alternately repeated 20 times to form a Sr—Ti—O-based film (SrO:TiO=1:1) according to a conventional ALD method. As a result, the film thickness was 4.5 nm and the composition ratio of Sr/Ti was 0.4 in a ratio of the number of atoms, and thus the amount of Sr was small. In other words, the adsorption inhibition of the Sr raw material occurred.

Figure 7:
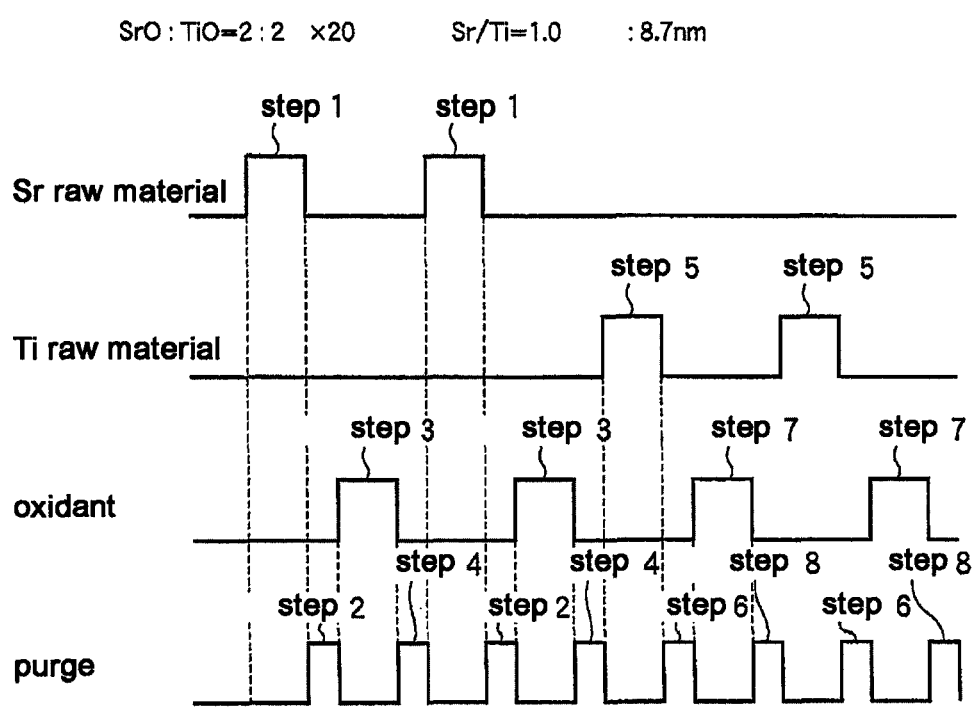
FIG. 7 shows a sequence, a film thickness, and a Sr/Ti composition ratio when a Sr—Ti—O-based film was formed by repeating a SrO film formation process in steps 1 to 4 twice, repeating a TiO film formation process in steps 5 to 8 twice, and repeating this set 20 times.

Meanwhile, as shown in FIG. 7, a set of repeating the SrO film formation process of steps 1 to 4 twice and subsequently repeating the TiO film formation process of steps 5 to 8 twice using the same raw materials was repeated 20 times to form a Sr—Ti—O-based film (SrO:TiO=2:2). As a result, the film thickness was 8.7 nm and the composition ratio of Sr/Ti was 1.0 in a ratio of the number of atoms, and thus the composition was the approximately stoichiometric composition. From this result, it was found that such a inhibition of the film formation was avoided through multiple repetitions of the film formation process using the same raw material.

Figure 8:
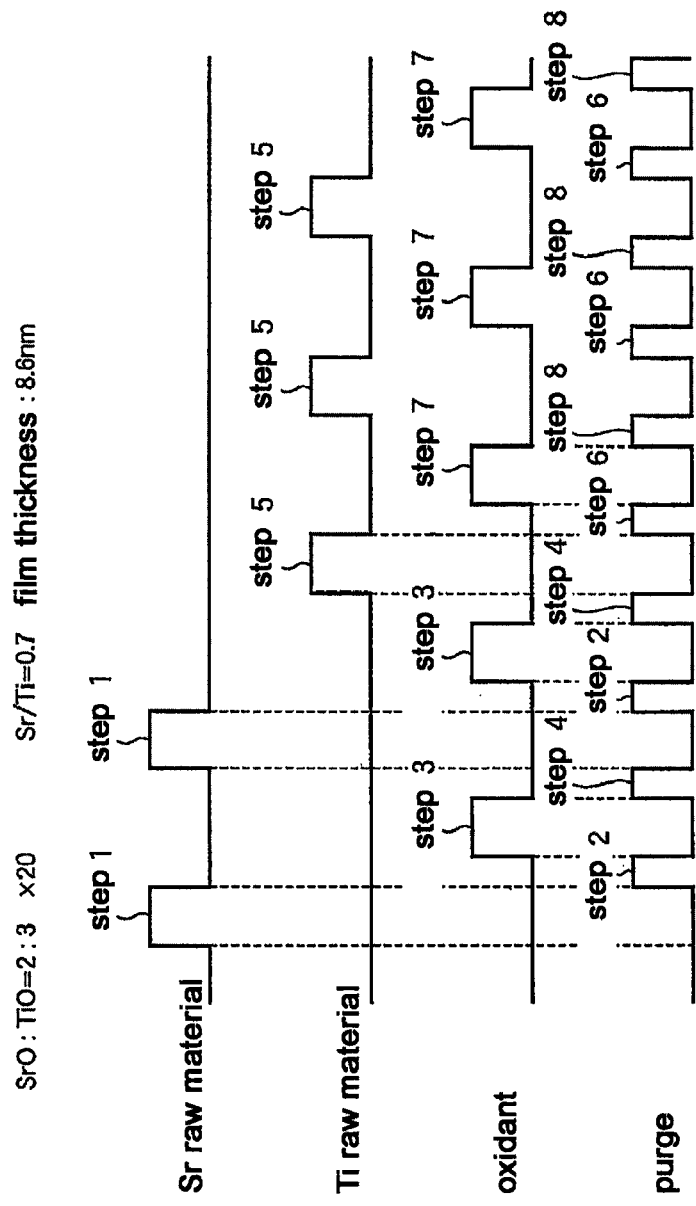
FIG. 8 shows a sequence, a film thickness, and a Sr/Ti composition ratio when a Sr—Ti—O-based film was formed by repeating a SrO film formation process in steps 1 to 4 twice, repeating a TiO film formation process in steps 5 to 8 three times, and repeating this set 20 times.

Also, as shown in FIG. 8, a set of repeating the SrO film formation process of steps 1 to 4 twice and subsequently repeating the TiO film formation process of steps 5 to 8 three times was repeated 20 times to form a Sr—Ti—O-based film (SrO:TiO=2:3). As a result, the film thickness was 8.6 nm and the composition ratio of Sr/Ti was 0.7 in a ratio of the number of atoms. From the result, it was found that a required composition ratio was obtained when the repetition number of a film formation process of the same raw material was changed.

The detailed description in regard to steps 1 to 8 is the same as that of the first exemplary embodiment. A sequence of continuously repeating the SrO film formation process and/or the TiO film formation process multiple times is employed to form the Sr—Ti—O-based film as described above. Then, $O_2$ gas is supplied from oxidant source 54 at a predetermined flow rate, thereby certainly oxidizing the film. Next, after the supply of all gases is stopped and the inside of the processing chamber is vacuumized, semiconductor wafer W within processing chamber 1 is taken out by the carrying arm.

In the above-described sequence, a valve or a mass flow controller is controlled by process controller 90 based on the recipe stored in storage unit 92 in the same manner as the first exemplary embodiment.

Hereinafter, the actual example of forming the film according to the present embodiment will be described.

In the apparatus in FIG. 1, the temperature of the loading table was set to be a film forming temperature of 320° C. by adjusting a lamp power and a 200 mm Si wafer was taken into the processing chamber using an arm of a carrying robot, thereby forming a Sr—Ti—O-based film. $Sr(C_5(CH_3)_5)_2$ used as a Sr raw material was kept in a container heated up to 160° C. and was supplied to the processing chamber by bubbling with Ar gas as a carrier gas. $Ti(OiPr)_4$ used as a Ti raw material was kept in a container heated up to 45° C. and was supplied to the processing chamber by bubbling with Ar gas as a carrier gas in the same manner as the Sr raw material. Also, an oxidant was $O_3$ having a concentration of 180 $g/m^3$ and generated by passing $O_2$ gas of 500 mL/min (sccm) and $N_2$ gas of 0.5 mL/min (sccm) through an ozone generator.

Then, after the loading of the Si wafer on the loading table by an arm, a dilution Ar gas was supplied at a flow rate of 300 mL/min(sccm) for 30 seconds while the Si wafer was heated to a film forming temperature at a pressure of 133 Pa (1 Torr). Next, the film formation was carried out according to the above-described steps 1 to 8. Also, the temperature of the wafer was 290° C.

The Sr raw material supply of step 1 was performed for 10 seconds in a state where the flow rate of carrier Ar gas was 50 mL/min (sccm), the flow rate of dilution Ar gas was 200 mL/min(sccm), and processing chamber 1 was exhausted by completely opening a pressure control mechanism. The purging of step 2 was carried out for 10 seconds under a vacuum state.

The Sr raw material oxidization of step 3 was performed for 10 seconds in a state where the $O_3$ gas was used as an oxidant and processing chamber 1 was exhausted by completely opening the pressure control mechanism. The purging of step 4 was performed for 10 seconds under a vacuum state.

The Ti raw material supply of step 5 was performed for 10 seconds in a state where the flow rate of carrier Ar gas was 200 mL/min(sccm), the flow rate of dilution Ar gas was 200 mL/min(sccm), and processing chamber 1 was exhausted by completely opening a pressure control mechanism. The purging of step 6 was performed for 10 seconds under a vacuum state in the same manner as step 2.

The Ti raw material oxidization of step 7 and the purging of step 8 were carried out in the completely same manner as steps 3 and 4, respectively.

Then, the SrO film formation process of steps 1 to 4 and the TiO film formation process of steps 5 to 8 were alternately repeated 20 times. Next, $O_2$ gas was supplied at a flow rate of 300 mL/min (sccm) for 20 seconds while the pressure was controlled to be 40 Pa (0.3 Torr). Then, in a state where the supply of gas is stopped, the inside of the processing chamber was maintained under a vacuum state for 20 seconds and the Si wafer was taken out from the processing chamber.

The Sr—Ti—O-based film formed by the above-described sequence measured 4 nm in thickness. When this film was measured by XRF (X-ray fluorescence analysis), the ratio of Sr/Ti was 0.5 in a ratio of the number of atoms.

Meanwhile, a sequence of repeating the SrO film formation process of steps 1 to 4 twice and the TiO film formation process of steps 5 to 8 twice was repeatedly performed 10 times. Next, $O_2$ gas was supplied at a flow rate of 300 mL/min (sccm) for 10 seconds while the pressure was controlled to be 40 Pa (0.3 Torr). In a state where the supply of gas is stopped, the inside of the processing chamber was maintained under a vacuum state for 100 seconds and then the Si wafer was taken out from the processing chamber. The thickness of the formed Sr—Ti—O-based film was 5 nm. When the composition of this film was measured by XRF (X-ray fluorescence analysis), the ratio of Sr/Ti was 1.0 in a ratio of the number of atoms.

As described above, it was found that, when the sequence of continuously repeating the same film formation process was employed according to the present invention, it is possible to obtain a Sr—Ti—O-based film with a required composition without an influence of adsorbance inhibition.

Third Exemplary Embodiment

In the same manner as the first exemplary embodiment, in the third exemplary embodiment, gate valve 38 is opened first, and a semiconductor wafer W is taken from loading/unloading hole 39 into processing chamber 1 and is loaded on loading table 3. Since loading table 3 has been previously heated by heating lamps 32, semiconductor wafer W is heated up to a predetermined temperature, for example, 200 to 400° C. Then, dilution gas, such as Ar gas, from dilution gas source 55 is supplied at a flow rate of 100 to 800 mL/sec (sccm). Meanwhile, the inside of processing chamber 1 is exhausted by a vacuum pump (not shown) via exhaust hole 36 and exhaust pipe 37, thereby vacuum-exhausting processing chamber 1 so that the pressure within processing chamber 1 is approximately 39 to 665 Pa. Then, the film formation is actually started by controlling the flow rate of the dilution gas, such as Ar gas, to be in a range of 100 to 500 mL/sec (sccm) and controlling the pressure within processing chamber 1 to be a film forming pressure of 39 to 266 Pa.

In the present exemplary embodiment, a SrO film formation process for forming a thin SrO film and a TiO film formation process for forming a thin TiO film are performed multiple times to form a Sr—Ti—O-based film. The SrO film formation process includes a step for supplying a Sr raw material into processing chamber 1 (step 1), a step for purging the inside of processing chamber 1 (step 2), a step for decomposing and oxidizing the Sr raw material by supplying an oxidant into processing chamber 1 (step 3), and a step for purging the inside of processing chamber 1 (step 4). The TiO film formation process includes a step for supplying a Ti raw material into processing chamber 1 (step 5), a step for purging the inside of processing chamber 1 (step 6), a step for decomposing and oxidizing the Ti raw material by supplying an oxidant into processing chamber 1 (step 7), and a step for purging the inside of processing chamber 1 (step 8). In the present embodiment, $O_3$ and $H_2O$ are used as the oxidant.

In an ALD method, the supply time for respective materials and an oxidant is set as a time where a film thickness is saturated. However, when $O_3$ is used as an oxidant, it takes a longer time to reach the saturation point according to a kind of an organic Sr compound used as a Sr raw material and the film thickness becomes 0.3 to 0.4 nm per one cycle at the saturation point, which is very thick. This may prevent the formation of a required SrO film. In other words, in a case where only $O_3$ is used as an oxidant and a specific organic Sr compound, such as $Sr(C_5(CH_3)_5)_2$, is used as a Sr raw material, SrO is formed after the bond in an organic moiety of the organic Sr compound used as the Sr raw material is cleaved. Thus, it takes time to complete the cleavage.

On the other hand, in a case where $H_2O$ is used as the oxidant, the bond in the organic moiety is hardly cleaved and the bond between Sr and the organic moiety is mainly cleaved. Thus, this reduces the saturation time. However, if $H_2O$ is only used as the oxidant, $Sr(OH)_2$ is formed and an undesirable result occurs. Accordingly, in the present embodiment, $H_2O$ is used to cleave a bond between Sr and an organic moiety and $O_3$ is used to form SrO, thereby obtaining a good SrO film.

Hereinafter, such a method will be described in detail.

Figure 9:
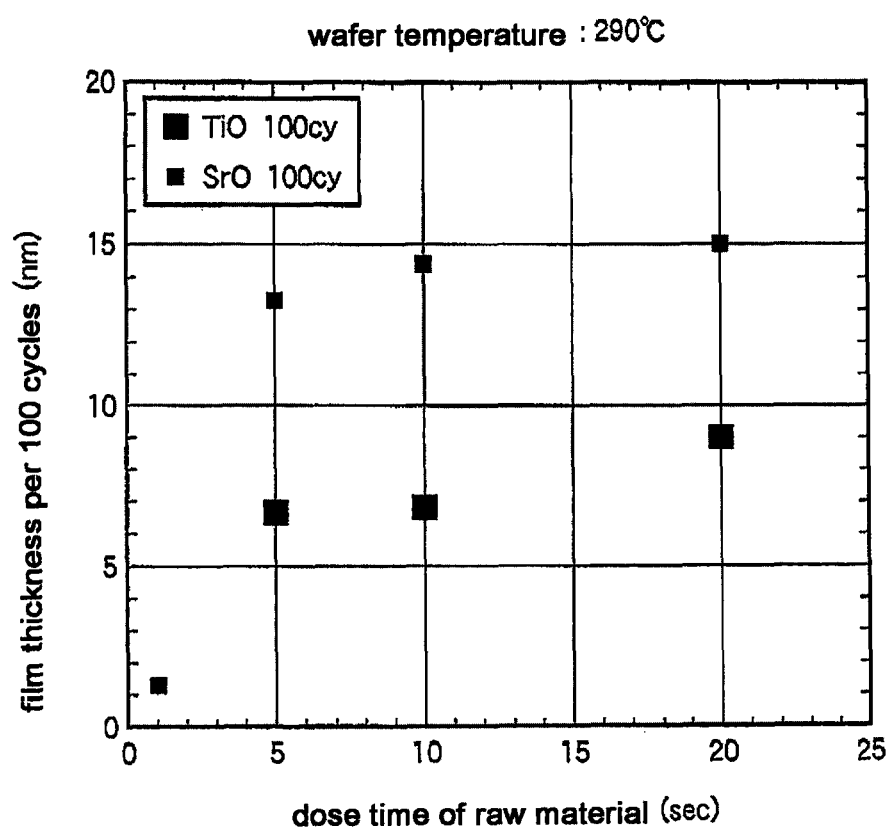
FIG. 9 is a view illustrating the relationship between the dose times of a Sr raw material and a Ti raw material and the thickness of a SrO film and a TiO film.

FIG. 9 illustrates the relationship between the dose time of each raw material and the thickness of a SrO (or TiO) film when $Sr(C_5(CH_3)_5)_2$ was used as a Sr raw material and $Ti(OiPr)_4$ was used as a Ti raw material. As shown in FIG. 9, each raw material was saturated in approximately 5 seconds and the thickness of the SrO film was thicker than that of the TiO film. Also, herein, the temperature of the wafer was 290° C.

Figure 10:
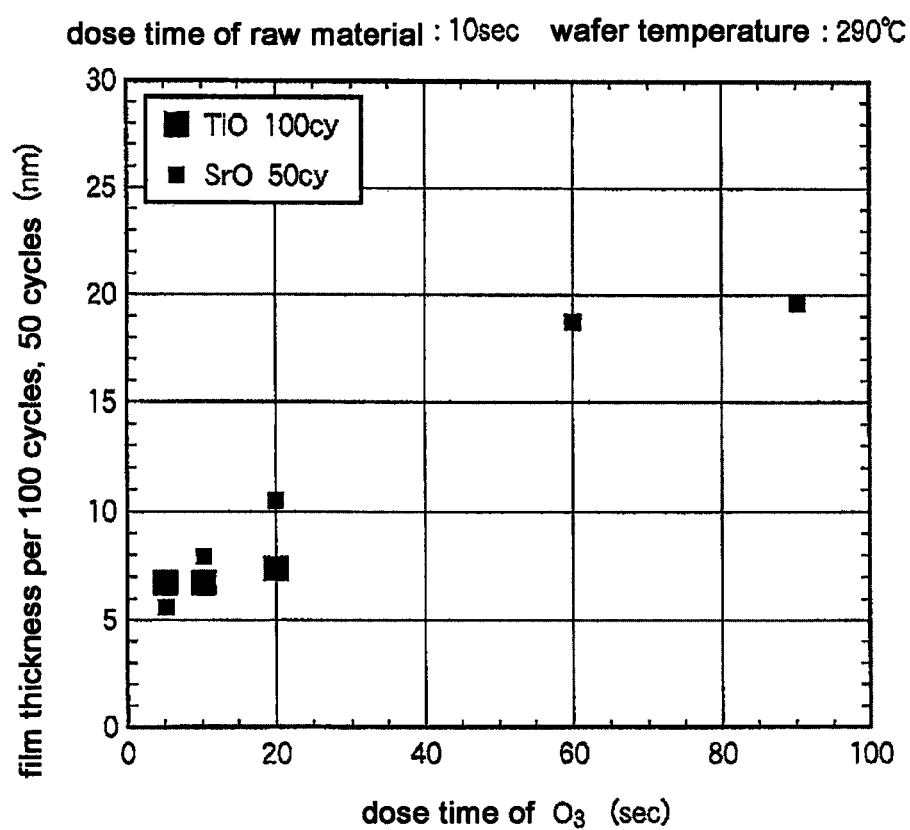
FIG. 10 is a view illustrating the relationship between the dose time of $O_3$ and the thickness of a SrO film and a TiO film.

FIG. 10 illustrates the relationship between the dose time of $O_3$ and the thickness of a SrO (or TiO) film when $O_3$ was used as an oxidant. As shown in FIG. 10, the TiO film was saturated within a short time, but the SrO film was not saturated even in 60 seconds. Also, herein, the dose time of the Sr raw material and the Ti raw material was 10 seconds and the temperature of the wafer was 290° C.

Figure 11:
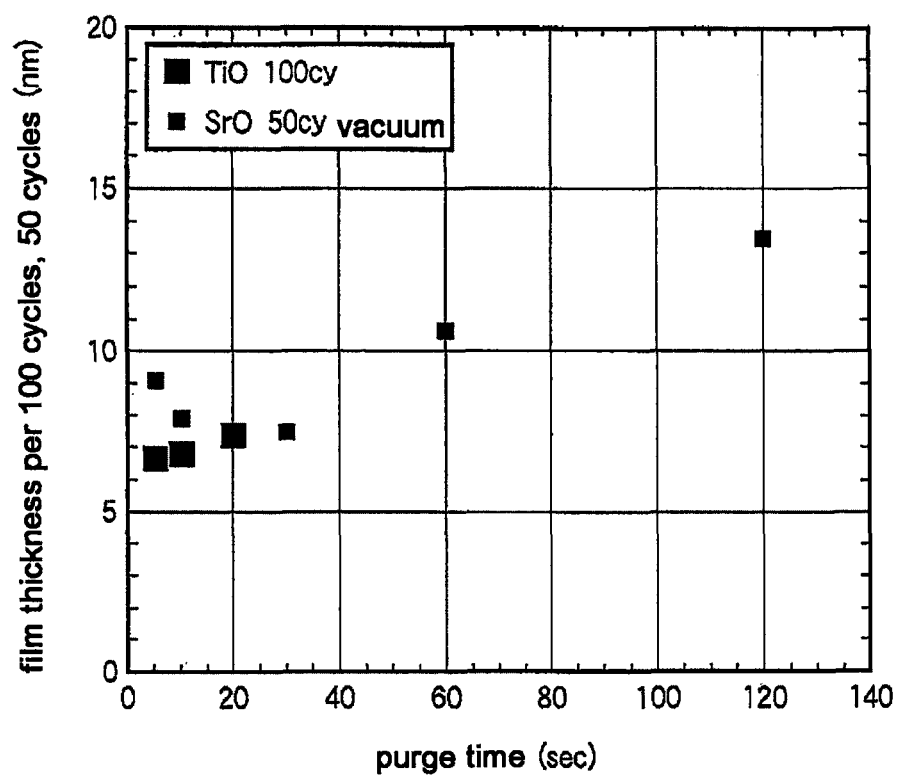
FIG. 11 is a view illustrating the relationship between the purge time and the thickness of a SrO (or TiO) film when the purging was carried out under a vacuum state.
Figure 12:
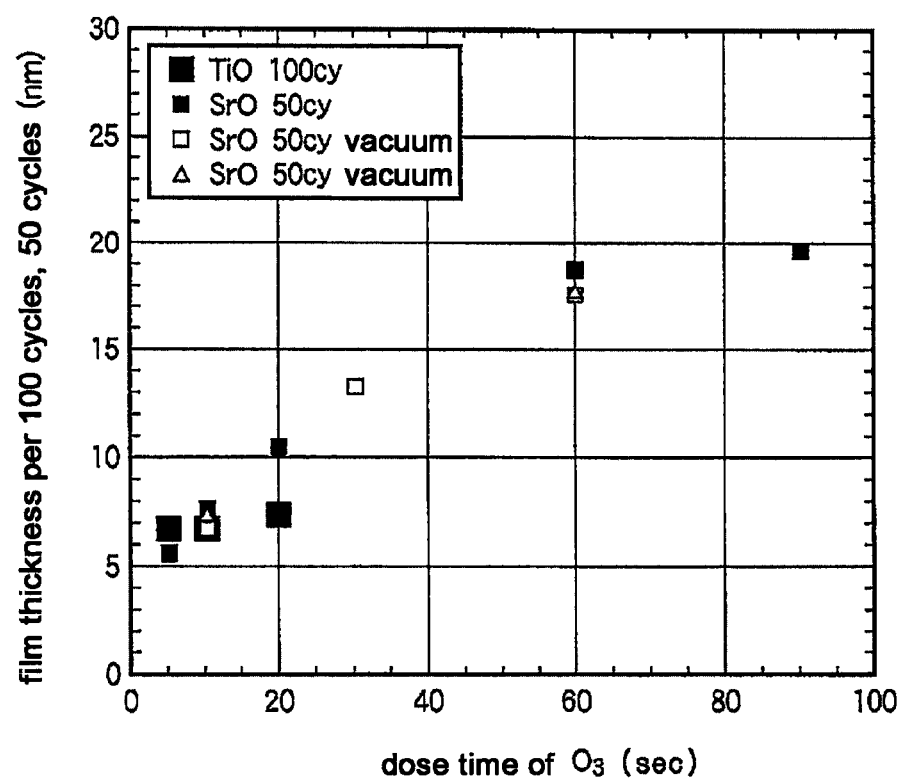
FIG. 12 shows the relationship between the dose time of $O_3$ and the thickness of a SrO (or TiO) film, when vacuum purging was added.

FIG. 11 illustrates the relationship between the purge time and the thickness of a SrO (or TiO) film when the purging was carried out under a vacuum state. As shown in FIG. 11, even when the purging is carried out under a vacuum state, the thickness of a SrO film increases according to the increase of the purge time. Also, FIG. 12 shows the relationship between the dose time of $O_3$ and the thickness of a SrO (or TiO) film when the result of vacuum purging was reflected. However, it was found that the growth of the SrO film according to the increase of the dose time of $O_3$ cannot be inhibited even though the purging method is changed.

The reason of the growth of the SrO film is conceived that, as an oxidizing time increases, an organic moiety existing in an organic Sr raw material, such as $(C_5(CH_3)_5)_2$, is not rapidly separated from Sr and the organic moiety is decomposed in oxidizing the organic Sr raw material with $O_3$, and thus more amount of Sr raw material is adsorbed during the next dose of the Sr raw material.

Accordingly, in the present exemplary embodiment, $H_2O$ capable of firstly cleaving a bond between Sr and an organic moiety is used as the oxidant to separate the organic moiety in some extent, and then $O_3$ is supplied to perform oxidation.

Hereinafter, the fabrication conditions will be described in detail. The ALD method is typically employed for the sequence. The ALD method repeats a SrO film formation process and a TiO film formation process, alternately.

Steps 1 to 8 are substantially same as those in the first exemplary embodiment except for an oxidant and the order of the oxidization of step 3.

The Sr raw material oxidization of step 3 in the present embodiment includes firstly performing one oxidization with $H_2O$ vapor as an oxidant (step 3-1) and subsequently performing another oxidization with $O_3$ (step 3-2). Step 3-1 is performed for approximately 0.1 to 5 seconds at a $H_2O$ flow rate of approximately 2 to 50 mL/min (sccm). In step 3-2, an ozone generator may be used as oxidant source 54 to supply $O_3$ at a flow rate of approximately 50 to 200 g/$Nm^3$. Herein, $O_2$ gas having a flow rate of approximately 100 to 1000 mL/min (sccm) may be used together. Step 3-2 is performed for approximately 0.1 to 10 seconds. Both $H_2O$ and $O_3$ may be simultaneously supplied. $O_2$ of which dew point has been adjusted to 0 to 40° C. may be supplied through the ozone generator. Also, $H_2$ and $O_2$ which have been supplied through remote plasma may be used as an oxygen source.

Figure 13:
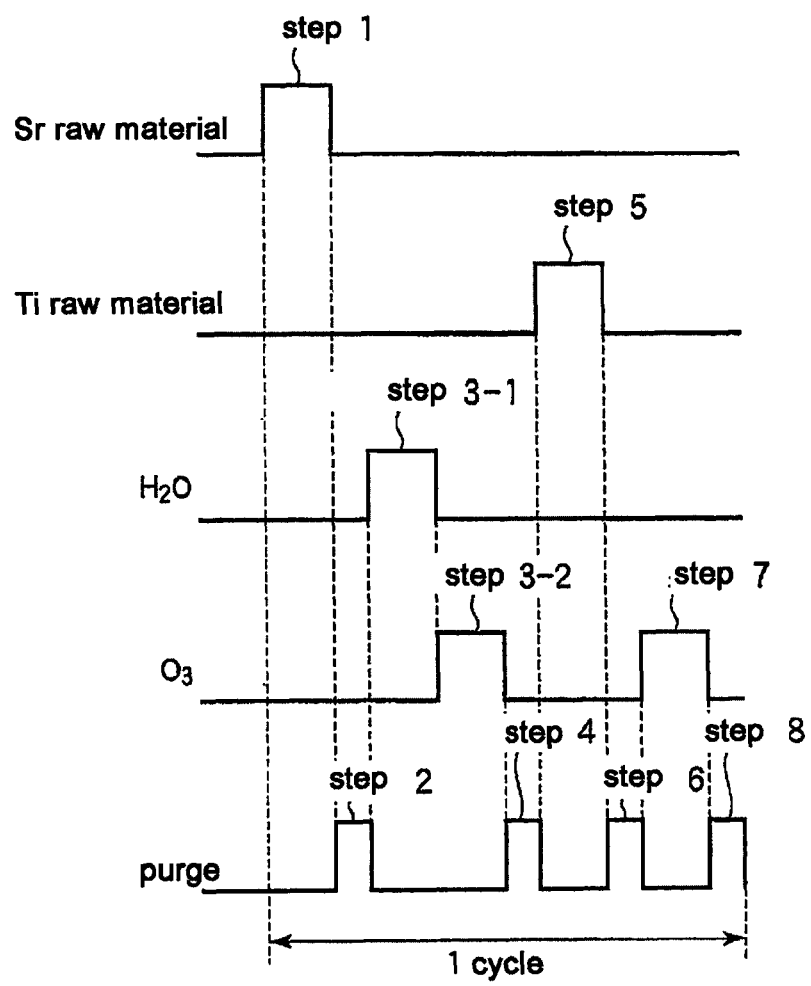
FIG. 13 shows a sequence of film formation according to a third exemplary embodiment of the present invention.

The detailed sequence according to the present exemplary embodiment is carried out in the same manner as described in FIG. 13.

The SrO film formation process and the TiO film formation process are alternately repeated as described above to form the Sr—Ti—O-based film, and then $O_2$ gas is supplied from oxidant source 54 at a predetermined flow rate, thereby securely oxidizing the film. Then, the supply of all gases is stopped and the inside of the processing chamber is vacuumized. Next, semiconductor wafer W within processing chamber 1 is taken out by a carrying arm.

In the above-described sequence, a valve or a mass flow controller is controlled by process controller 90 based on the recipe stored in storage unit 92 in the same manner as the first exemplary embodiment.

Hereinafter, the actual example of forming the film according to the present embodiment will be described.

In the apparatus in FIG. 1, the temperature of the loading table was set to be a film forming temperature of 320° C. by adjusting a lamp power and a 200 mm Si wafer was carried into the processing chamber using an arm of a carrying robot, thereby forming a Sr—Ti—O-based film. $Sr(C_5(CH_3)_5)_2$ used as a Sr raw material was kept in a container heated up to 160° C. and was supplied to the processing chamber through bubbling by using Ar gas as a carrier gas. $Ti(OiPr)_4$ used as a Ti raw material was kept in a container heated up to 40° C. and was supplied to the processing chamber by bubbling with Ar gas as a carrier gas in the same manner as the Sr raw material. Also, $H_2O$ and $O_3$ with a concentration of 180 g/$m^3$ were used as an oxidant. Herein, $H_2O$ had been heated up to 40° C. and its flow rate was controlled by a high temperature mass flow controller heated up to 50° C. Also, $O_3$ had been generated by passing $O_2$ gas of 500 mL/min (seem) and $N_2$ gas of 0.5 mL/min (seem) through an ozone generator.

Then, the Si wafer was loaded on the loading table by an arm, and a dilution Ar gas was supplied at a flow rate of 300 mL/min (seem) for 30 seconds while the Si wafer was heated to a film forming temperature at a pressure of 133 Pa (1 Torr). Next, the film formation was carried out according to the above-described steps 1 to 8. Also, the temperature of the wafer was 290° C.

The Sr raw material supply of step 1 was performed for 10 seconds in a state where the flow rate of carrier Ar gas was 50 mL/min (seem), the flow rate of dilution Ar gas was 200 mL/min (seem), and processing chamber 1 was exhausted by completely opening a pressure control mechanism. The purging of step 2 was carried out for 10 seconds under a vacuum state.

The Sr raw material oxidization of step 3 was performed by flowing $H_2O$ vapor for 3 seconds (step 3-1) and then flowing $O_3$ for 5 seconds (step 3-2). Steps 3-1 and 3-2 were performed in a state where processing chamber 1 was exhausted by completely opening the pressure control mechanism. The purging of step 4 was performed for 10 seconds under a vacuum state.

The Ti raw material supply of step 5 was performed for 10 seconds in a state where the flow rate of carrier Ar gas was 200 mL/min(sccm), the flow rate of dilution Ar gas was 200 mL/min(sccm), and processing chamber 1 was exhausted by completely opening a pressure control mechanism. The purging of step 6 was performed for 10 seconds under a vacuum state in the same manner as step 2.

The Ti raw material oxidization of step 7 was carried out for 10 seconds using $O_3$ gas as an oxidant in a state where the inside of the processing chamber is vacuumized. The purging of step 8 was carried out in the completely same condition as step 4.

Then, the SrO film formation process of steps 1 to 4 and the TiO film formation process of steps 5 to 8 were alternately repeated 50 times. Next, $O_2$ gas was supplied at a flow rate of 300 mL/min (sccm) for 20 seconds while the pressure was controlled to be 40 Pa (0.3 Torr). In a state where the supply of gas is stopped, the inside of the processing chamber was maintained under a vacuum state for 20 seconds and then the Si wafer was taken out from the processing chamber. The Sr—Ti—O-based film formed by the above-described sequence measured 12 nm in thickness. The amount of C of the film was measured not more than a detection limit (1%) by XPS (X-ray photoelectron spectroscopy). In other words, it was found that the organic moiety of the Sr raw material was hardly decomposed by the oxidant.

Also, the present invention is not limited to the above exemplary embodiments and may be variously modified.

Figure 14:
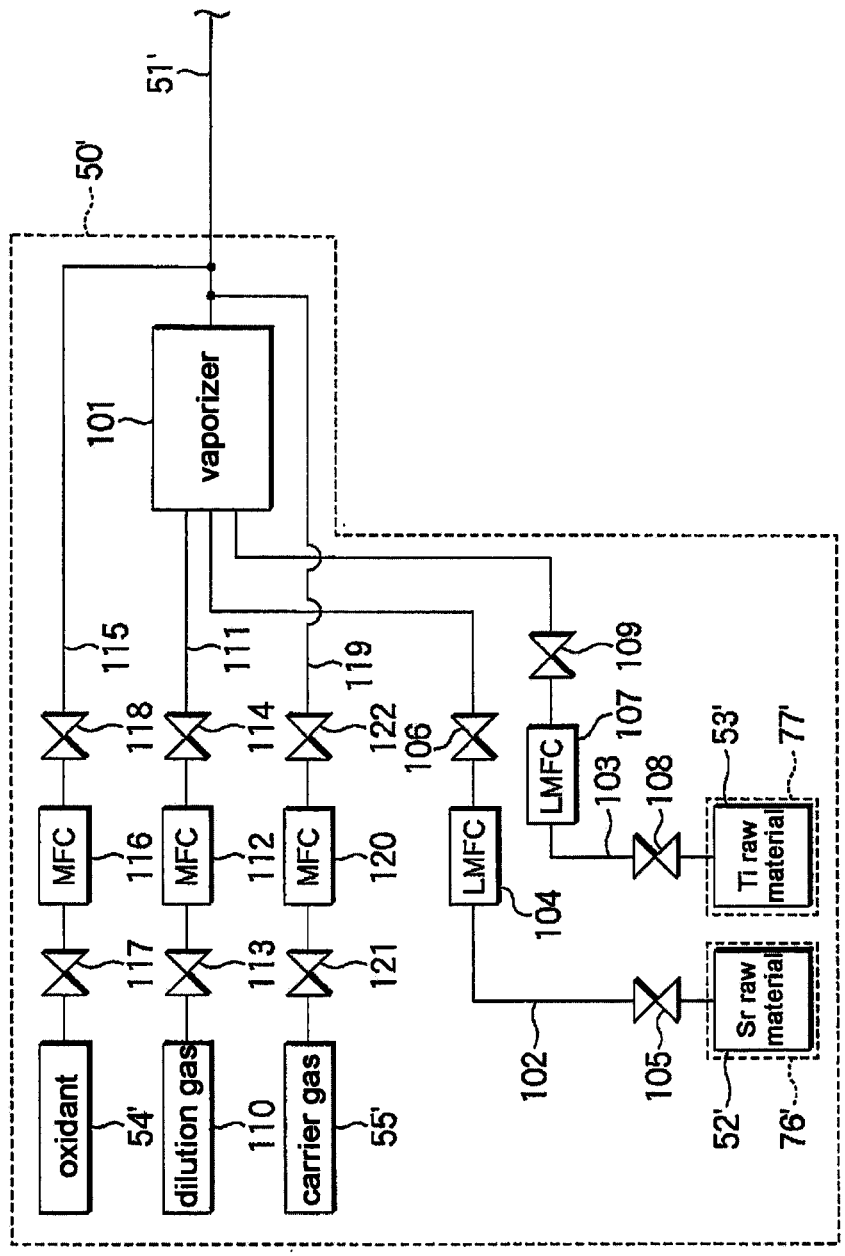
FIG. 14 shows another example of a processing gas supply mechanism.

For example, although processing gas supply mechanism 50 is used for supplying a raw material by bubbling in the above-described film forming apparatus, another processing gas supply mechanism 50' using a vaporizer may be used for supplying a raw material as shown in FIG. 14. Processing gas supply mechanism 50' includes a Sr raw material reservoir 52' to store a Sr raw material dissolved in a solvent, a Ti raw material reservoir 53' to store a Ti raw material dissolved in a solvent, an oxidant source 54' to supply an oxidant, and a vaporizer 101 to vaporize the Sr raw material and the Ti raw material. A pipe 102 is provided from Sr raw material reservoir 52' to vaporizer 101 and a pipe 103 is provided from Ti raw material reservoir 53' to vaporizer 101. Liquids are supplied from Sr raw material reservoir 52' and Ti raw material reservoir 53' to vaporizer 101 by carrier gas, a pump, or the like. Pipe 102 is provided with a liquid mass flow controller (LMFC) 104 as a flow controller, and open/close valves 105 and 106 downstream and upstream of LMFC 104. Pipe 103 is provided with a LMFC 107 and open/close valves 108 and 109 downstream and upstream of LMFC 107. Heaters 76' and 77' are provided at Sr raw material reservoir 52', and Ti raw material reservoir 53', respectively. The Sr raw material which is stored in Sr raw material reservoir 52' and dissolved in the solvent, and the Ti raw material which is stored in Ti raw material reservoir 53' and dissolved in the solvent, are heated up to a predetermined temperature by heaters 76' and 77'. Then, the raw materials are supplied to vaporizer 101 by a pump, carrier gas, or the like in a liquid state. Also, although not shown, the pipes through which the Sr raw material or the Ti raw material flows, are also provided with heaters.

A pipe 51' extending to shower head 40 is connected to vaporizer 101. A pipe 111 extending from a carrier gas source 110 for supplying a carrier gas, such as Ar gas, is connected to vaporizer 101. A carrier gas is supplied to vaporizer 101 through pipe 111 and the Sr raw material and the Ti raw material, which have been vaporized by heating up to, for example, 100 to 200° C. within vaporizer 101, can be introduced into processing chamber 1 via pipe 51', and shower head 40. Pipe 111 is provided with a mass flow controller (MFC) 112 as a flow controller and open/close valves 113 and 114 downstream and upstream of MFC 112. A pipe 115 is provided from oxidant source 54' to pipe 51', thereby introducing the oxidant into processing chamber 1 from pipe 115 through pipe 51' and shower head 40. Pipe 115 is provided with a mass flow controller (MFC) 116 as a flow controller, open/close valves 117 and 118 downstream and upstream of MFC 116. Gas supply mechanism 50' also includes a dilution gas source 55' for supplying dilution gas, such as argon gas, to dilute the gas within processing chamber 1. A pipe 119 extending to pipe 51' is provided to dilution gas source 55', thereby introducing the dilution argon gas into processing chamber 1 from pipe 119 through pipe 51' and shower head 40. Pipe 119 is provided with a mass flow controller (MFC) 120 as a flow controller, open/close valves 121 and 122 downstream and upstream of MFC 120.

The formation of a Sr—Ti—O-based film using gas supply mechanism 50' is basically carried out in the same manner as the above described sequence except for the supply of a Sr raw material in step 1 and the supply of a Ti raw material in step 5.

In supplying a Sr raw material in step 1, the Sr raw material is dissolved in a solvent, such as octane, cyclohexane, or the like, in Sr raw material reservoir 52'. Herein, the concentration preferably ranges from 0.05 to 1 mol/L. The Sr raw material is supplied to vaporizer 101 heated up to 100 to 200° C. and is vaporized. Herein, the flow rate of the dilution gas, such as Ar gas, from dilution gas source 55' ranges from 100 to 500 mL/min(sccm), and the flow rate of the carrier gas, such as Ar gas, from the carrier gas source 110 ranges from 100 to 500 mL/min (sccm). This process is carried out for approximately the same period as that of the bubbling supply.

In supplying a Ti raw material in step 1, the Ti raw material is dissolved in a solvent, such as octane, cyclohexane, or the like, in Ti raw material reservoir 53'. The Ti raw material is carried to vaporizer 101 heated up to 150 to 230° C. and is vaporized. Herein, the concentration preferably ranges from 0.05 to 1 mol/L. Herein, the flow rate of the dilution gas, such as Ar gas, from dilution gas source 55' ranges from 100 to 500 mL/min(sccm), and the flow rate of the carrier gas, such as Ar gas, from the carrier gas source 110 ranges from 100 to 500 mL/min(sccm). This process is carried out for approximately the same period as that of the bubbling supply.

Also, although in the above described embodiments, a to-be-treated substrate is heated by the heating of a lamp in a film forming apparatus. The substrate may be heated by a resistance heater. Also, although in the above described embodiments, a semiconductor wafer is used as the to-be-treated substrate, the present invention is not limited to the semiconductor wafer. Other substrates, such as a glass substrate for FPD, may be used.

Also, although in most of the above described embodiments, a pressure control mechanism is completely opened to exhaust a processing chamber during the film formation, the pressure may be maintained within a required range of 13 to 266 Pa by operating the pressure control mechanism. Also, although in the above described embodiments, the purging is carried out under a vacuum state without the through-flow of gas, the present invention is not limited thereto. In a state where inert gas, such as Ar gas, is flowed through at a rate of approximately 100 to 1000 mL/min(sccm), the pressure control mechanism may be completely opened to exhaust the processing chamber. Otherwise, the pressure may be maintained within a range 20 to 266 Pa.

Also, the respective exemplary embodiments may be appropriately used in combination within the scope of the present invention.

INDUSTRIAL APPLICABILITY

The Sr—Ti—O-based film according to the present invention is effective as an electrode for an MIM (metal-insulator-metal) structure capacitor.

What is claimed is:
1. A method for forming a Sr—Ti—O-based film on a substrate, the method comprising:
disposing the substrate within a processing chamber,
heating the substrate, and
forming the Sr—Ti—O-based film on the substrate by
introducing a gaseous Ti raw material, a gaseous Sr raw material, and a gaseous oxidant $H_2O$ and $O_3$ into the processing chamber in a state where the substrate is heated, wherein a SrO film formation process and a TiO film formation process are performed multiple times, respectively, in said forming of the Sr—Ti—O-based film, wherein the SrO film formation process comprises adsorbing Sr onto the substrate by introducing the gaseous Sr raw material into the processing chamber, oxidizing Sr by introducing the gaseous oxidant $H_2O$ into the processing chamber first, stopping the introducing the gaseous oxidant $H_2O$, and then consecutively introducing the gaseous oxidant $O_3$ into the processing chamber, and then purging an inside of the processing chamber, and wherein the TiO film formation process comprises adsorbing Ti onto the substrate by introducing the gaseous Ti raw material into the processing chamber, oxidizing a Ti film by introducing the gaseous oxidant $O_3$ into the processing chamber, and then purging the inside of the processing chamber.

2. The method of claim 1, wherein the Sr raw material is a Sr compound having a cyclopentadienyl group.

3. The method of claim 2, wherein the Sr compound having the cyclopentadienyl group is $Sr(C_5(CH_3)_5)_2$.

4. The method of claim 2, wherein $H_2O$ of the oxidant has a function of cleaving Sr and the cyclopentadienyl group, and $O_3$ of the oxidant has a function of forming SrO.

* * * * *